(12) United States Patent
Lochtefeld et al.

(10) Patent No.: US 9,590,130 B2
(45) Date of Patent: Mar. 7, 2017

(54) THIN FILM SOLDER BOND

(75) Inventors: Anthony Lochtefeld, Ipswich, MA (US); Chris Leitz, Watertown, MA (US); Mark Carroll, Tewksbury, MA (US)

(73) Assignee: AMBERWAVE INC., Salem, NH (US)

( * ) Notice: Subject to any disclaimer, the term of this patent is extended or adjusted under 35 U.S.C. 154(b) by 314 days.

(21) Appl. No.: 13/460,786

(22) Filed: Apr. 30, 2012

(65) Prior Publication Data

US 2012/0273043 A1 Nov. 1, 2012

Related U.S. Application Data

(60) Provisional application No. 61/481,077, filed on Apr. 29, 2011, provisional application No. 61/547,211, filed on Oct. 14, 2011.

(51) Int. Cl.
*H01L 31/044* (2014.01)
*H01L 31/18* (2006.01)
*H01L 31/0687* (2012.01)

(52) U.S. Cl.
CPC .... *H01L 31/1804* (2013.01); *H01L 31/06875* (2013.01); *H01L 31/184* (2013.01); *H01L 31/1896* (2013.01); *Y02E 10/544* (2013.01); *Y02E 10/547* (2013.01); *Y02P 70/521* (2015.11)

(58) Field of Classification Search
CPC ........ Y02E 10/50–10/60; H01L 31/00–31/078
USPC .................................................. 136/243–265
See application file for complete search history.

(56) References Cited

U.S. PATENT DOCUMENTS

| | | | |
|---|---|---|---|
| 5,428,249 A * | 6/1995 | Sawayama et al. .......... 257/746 |
| 5,935,345 A * | 8/1999 | Kuznicki ....................... 136/255 |
| 2003/0041893 A1* | 3/2003 | Shimakawa .... H01L 31/022425 136/244 |
| 2004/0144420 A1* | 7/2004 | Takeyama ......... H01L 31/02008 136/256 |
| 2005/0115602 A1* | 6/2005 | Senta et al. .................... 136/250 |
| 2005/0121067 A1* | 6/2005 | Toyomura ......... H01L 31/02021 136/244 |
| 2005/0263178 A1* | 12/2005 | Montello et al. ............. 136/244 |
| 2006/0169989 A1* | 8/2006 | Bhattacharya et al. ........ 257/79 |
| 2007/0235077 A1* | 10/2007 | Nagata et al. ................. 136/256 |
| 2008/0001241 A1* | 1/2008 | Tuckerman et al. .......... 257/434 |
| 2008/0173698 A1* | 7/2008 | Marczi et al. ............. 228/180.1 |
| 2010/0126570 A1* | 5/2010 | Kizilyalli ............ H01L 31/0735 136/255 |
| 2011/0174376 A1* | 7/2011 | Lochtefeld et al. .......... 136/261 |
| 2012/0145231 A1* | 6/2012 | Woods et al. ................. 136/255 |

* cited by examiner

*Primary Examiner* — Bach Dinh

(57) ABSTRACT

A device, system, and method for solar cell construction and bonding/layer transfer are disclosed herein. An exemplary structure of solar cell construction involves providing a monocrystalline donor layer. A solder bonding layer bonds the donor layer to a carrier substrate. A porous layer may be used to separate the donor layer.

16 Claims, 34 Drawing Sheets

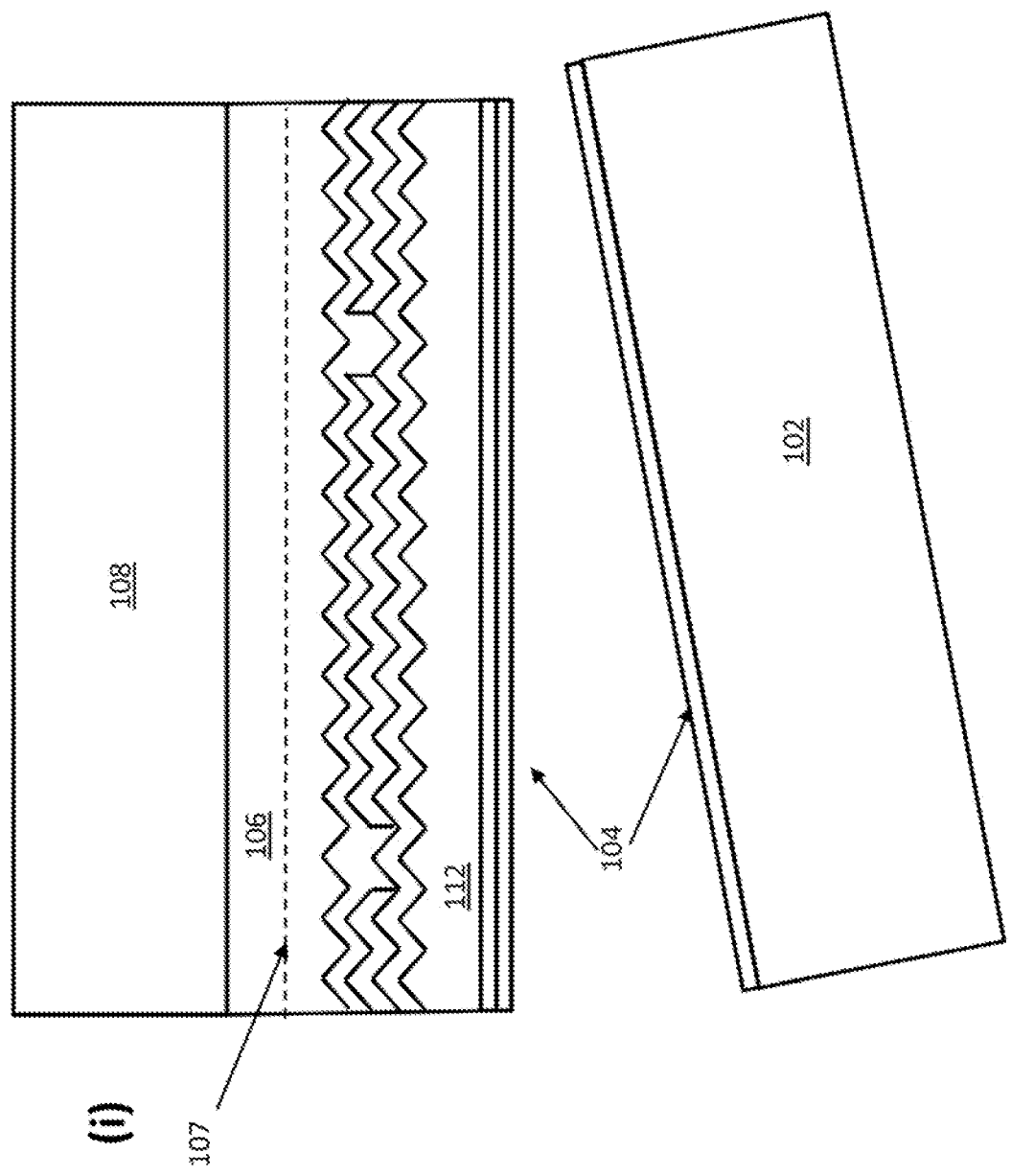

(a)

(a)

(f)

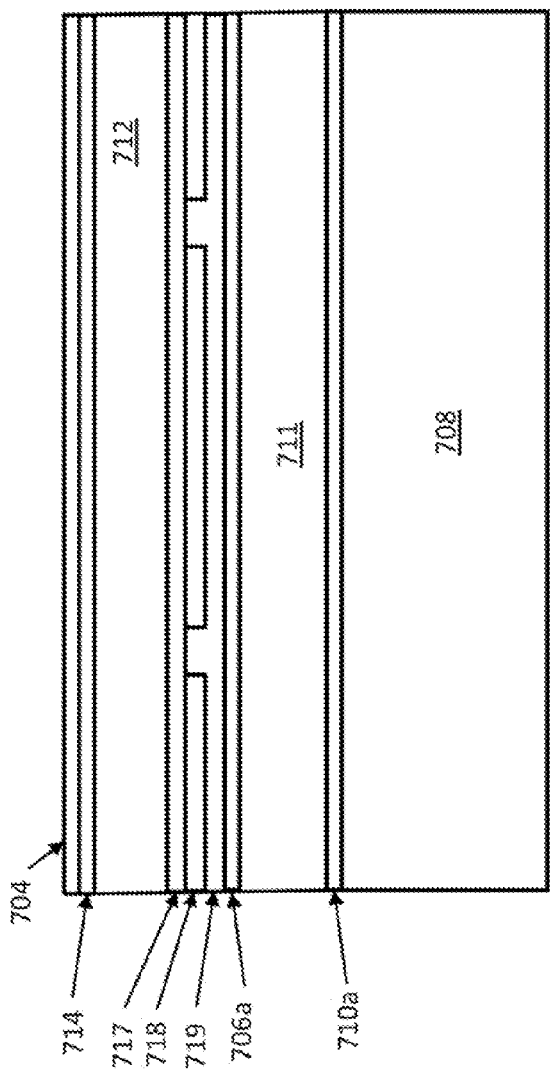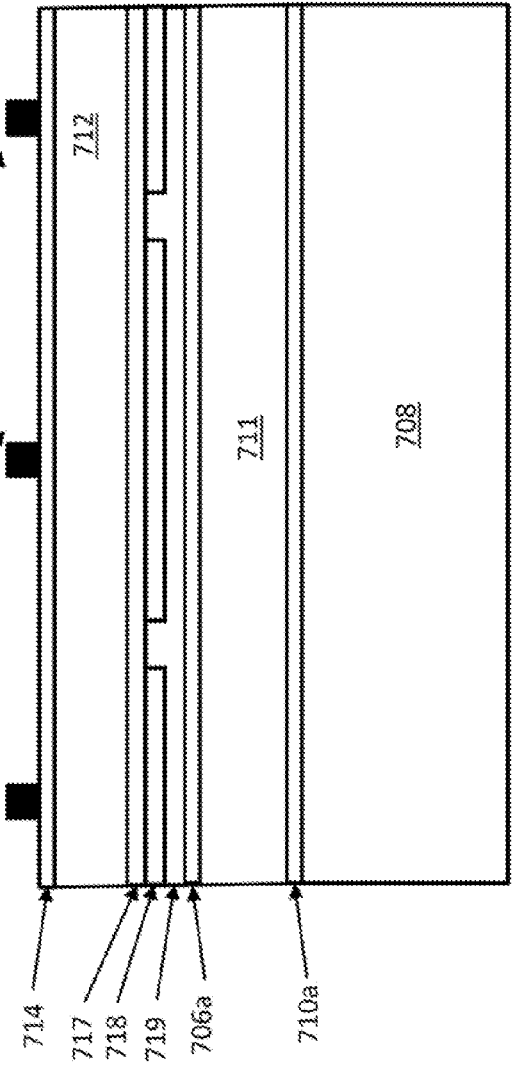
FIG. 7 (i) (j)

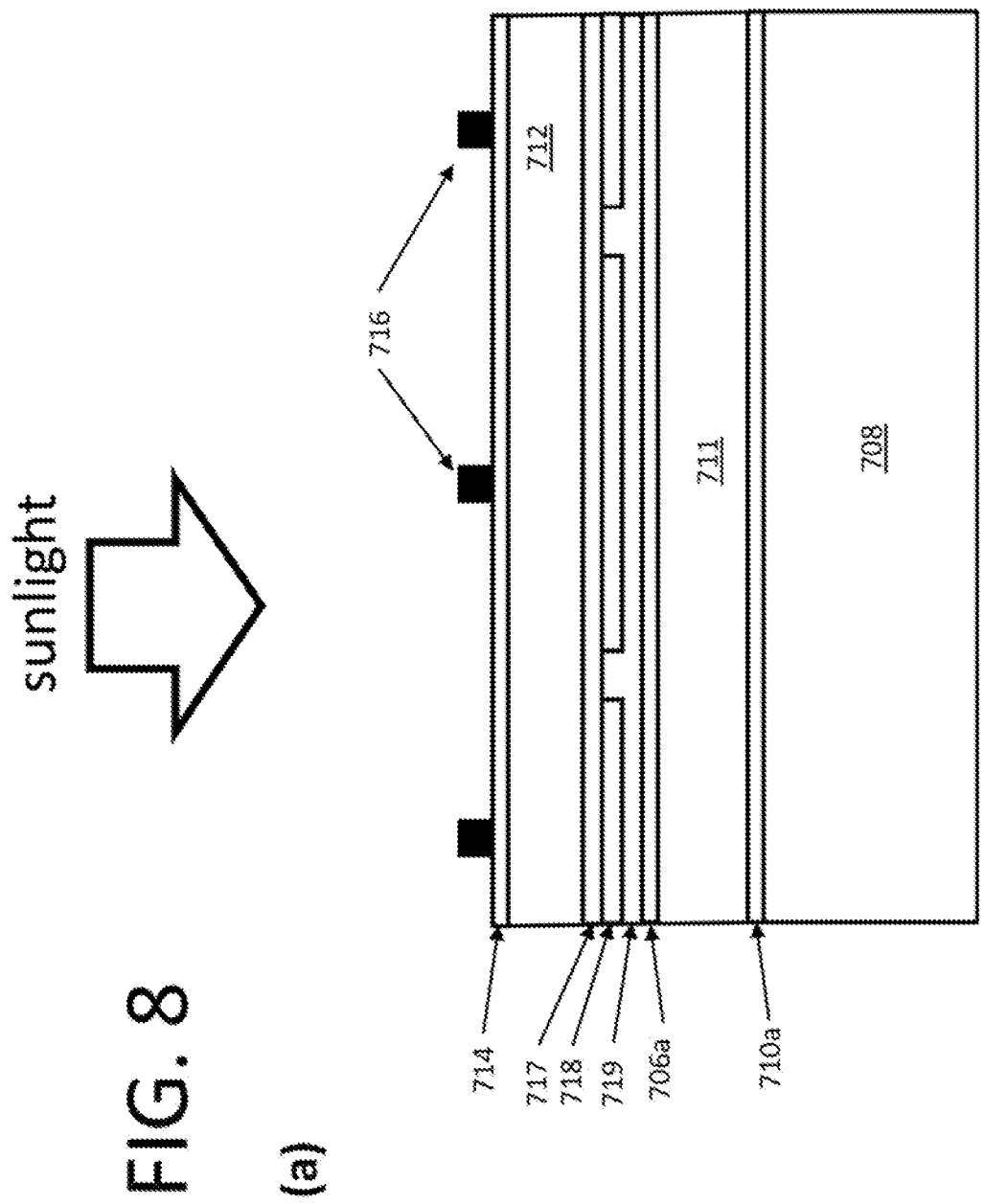

900

(d)

THIN FILM SOLDER BOND

RELATED APPLICATIONS

This application claims the benefit of and priority to U.S. Provisional Application Ser. No. 61/481,077 filed Apr. 29, 2011 and U.S. Provisional Application Ser. No. 61/547,211 filed Oct. 14, 2011, the disclosures of which are hereby incorporated by reference in their entirety.

TECHNICAL FIELD

The present invention relates to layer transfer and more particularly, relates to layer transfer of thin film material onto a substrate via solder bonding.

BACKGROUND INFORMATION

This invention relates generally to the construction of wafers and substrates used in the optoelectronic and electronic fields. In particular, it relates to a technique of wafer bonding and splitting to facilitate the transfer of thin film semiconductor materials used in making semiconductor substrates for solar cells, LEDs, LDs, optoelectronic integration circuits (OEIC) and microelectromechanical systems (MEMS).

SUMMARY

The present invention is a novel device, system, and method for a solar cell. An exemplary embodiment involves a monocrystalline solar cell device having a monocrystalline silicon or germanium layer solder bonded to a carrier substrate. The solder bonding layer may be a transient liquid phase bond. The transient liquid phase bond may produce an intermetallic region with a melting temperature higher than the individual components of the transient liquid phase bond.

Exemplary embodiments may include one or more of the following: The solder bonding layer may have a layer of one of tin and indium sandwiched between layers of one of chromium and titanium. The monocrystalline donor layer may include various epitaxially grown and transferred components. The solder bonding layer may provide a buried conductive layer providing a bottom electrical contact. The solder bonding layer may also provide light reflection for light absorption in the base solar cell region. The intermetallic alloy layer may be formed when two metal layers are interdiffused. The intermetallic alloy layer may have a melting point significantly higher than that of either of the two metal layers in pure form. The transient liquid phase bonding layer may comprise one of tin and indium sandwiched between one of nickel and copper to form an intermetallic region.

Another exemplary embodiment involves a method of monocrystalline solar cell construction. The method may involve providing a monocrystalline silicon donor substrate and forming a porous layer on the silicon donor substrate. A solar cell, may be constructed by means including epitaxial growth on the porous layer of the silicon donor substrate. A solder bonding layer may be deposited on the constructed solar cell and/or a carrier substrate. The donor substrate is bonded to the carrier substrate via the solder bonding layer. The donor substrate is cleaved at the porous layer. The solar cell, bonded by the solder bonding layer to the carrier, may undergo further construction.

The present invention is a novel device, system, and method for a solar cell. An exemplary embodiment involves a monocrystalline solar cell device having a monocrystalline silicon or germanium or III-V or II-VI compound semiconductor donor layer solder bonded to a carrier substrate. The solder bonding layer may be a transient liquid phase bond. The transient liquid phase bond may produce an intermetallic region with a melting temperature higher than the individual components of the transient liquid phase bond.

Exemplary embodiments may include one or more of the following: The solder bonding layer may have a layer of one of tin and indium sandwiched between layers of one of chromium and titanium. The monocrystalline donor layer may include various epitaxially grown and transferred components. The solder bonding layer may provide a buried conductive layer providing a bottom electrical contact. The solder bonding layer may also provide light reflection for light absorption in the base solar cell region. The intermetallic compound layer may be formed when two metal layers are interdiffused. The intermetallic compound layer may have a melting point significantly higher than that of either of the two metal layers in pure form. The transient liquid phase bonding layer may comprise one of tin and indium sandwiched between one of nickel, titanium, or copper to form an intermetallic region.

Another exemplary embodiment involves a method of monocrystalline solar cell construction. The method may involve providing a monocrystalline silicon donor substrate and forming a porous layer on the silicon donor substrate. A solar cell may be constructed by means including epitaxial growth on the porous layer of the silicon donor substrate. A solder bonding layer may be deposited on the constructed solar cell and/or a carrier substrate. The donor substrate is bonded to the carrier substrate via the solder bonding layer. The donor substrate is cleaved at the porous layer. The solar cell, bonded by the solder bonding layer to the carrier, may undergo further construction.

Yet another exemplary embodiment involves a method of compound semiconductor monocrystalline solar cell construction. The method may involve providing a monocrystalline Germanium, GaAs, or InP donor substrate and forming an implant layer within the donor substrate, to define a template layer for subsequent epitaxial growth. A solder bonding layer may be deposited over the donor substrate, proximate the template layer. The donor substrate with template layer is bonded to the carrier substrate via the solder bonding layer. The donor substrate is cleaved at the ion implant layer. The template layer, bonded by the solder bonding layer to the carrier, serves as the template for subsequent epitaxial growth of a compound semiconductor solar cell, such as a single-junction GaAs solar cell or a double junction InGaP/InGaAs solar cell.

The present invention is not intended to be limited to a system or method that must satisfy one or more of any stated objects or features of the invention. It is also important to note that the present invention is not limited to the exemplary or primary embodiments described herein. Modifications and substitutions by one of ordinary skill in the art are considered to be within the scope of the present invention, which is not to be limited except by the following claims.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENTS

General

Figure 1:
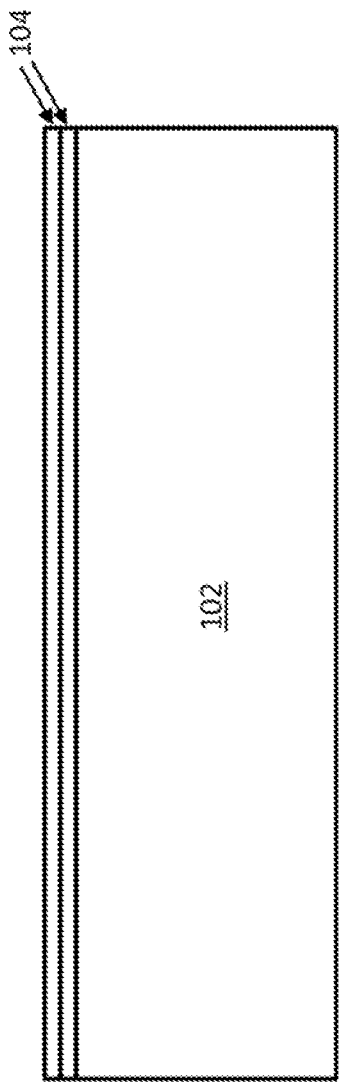
FIGS. 1(a-k) are profile diagrams of a device with silicon layer transfer constructed in accordance with an exemplary solder bonding embodiment of the invention.
Figure 1:
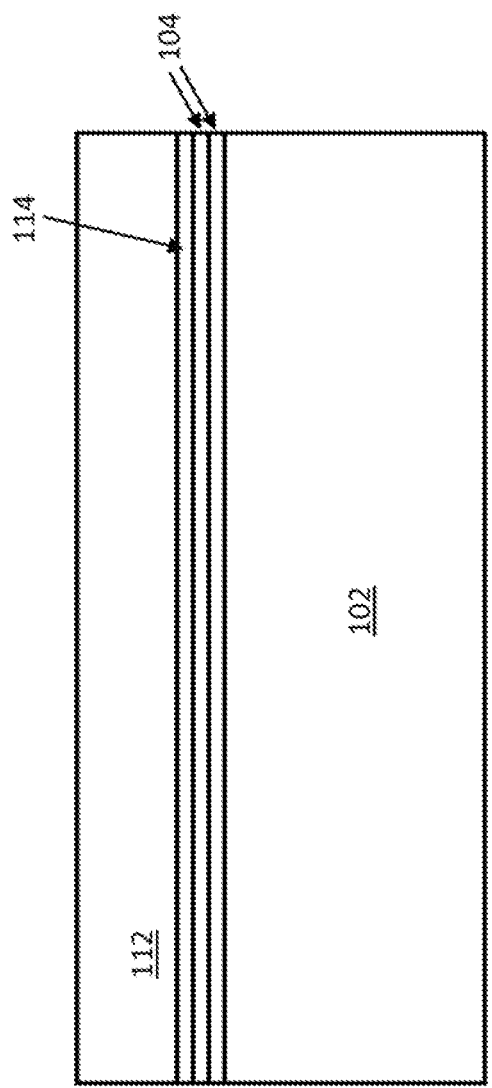
Figure 1:
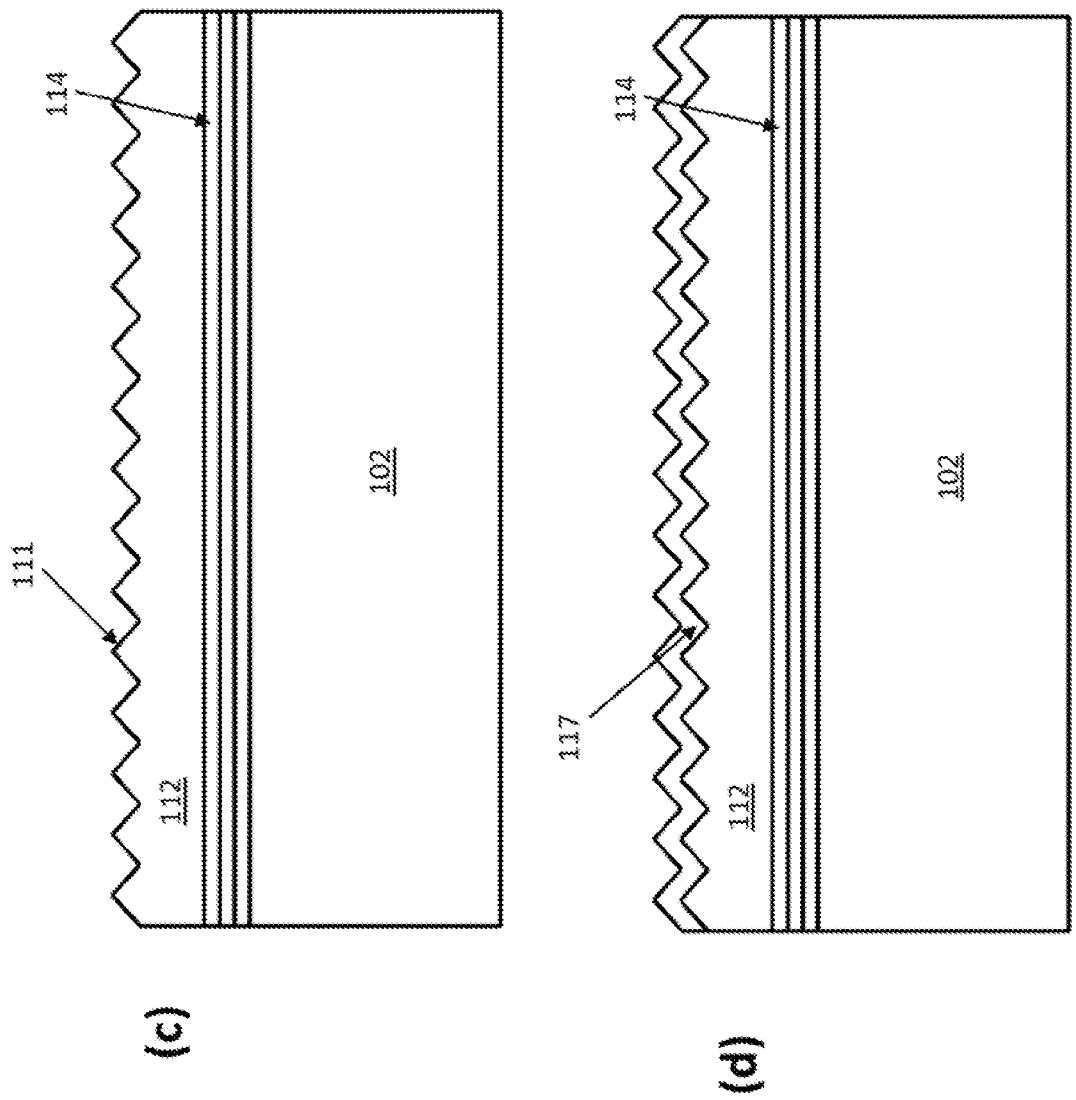
Figure 1:
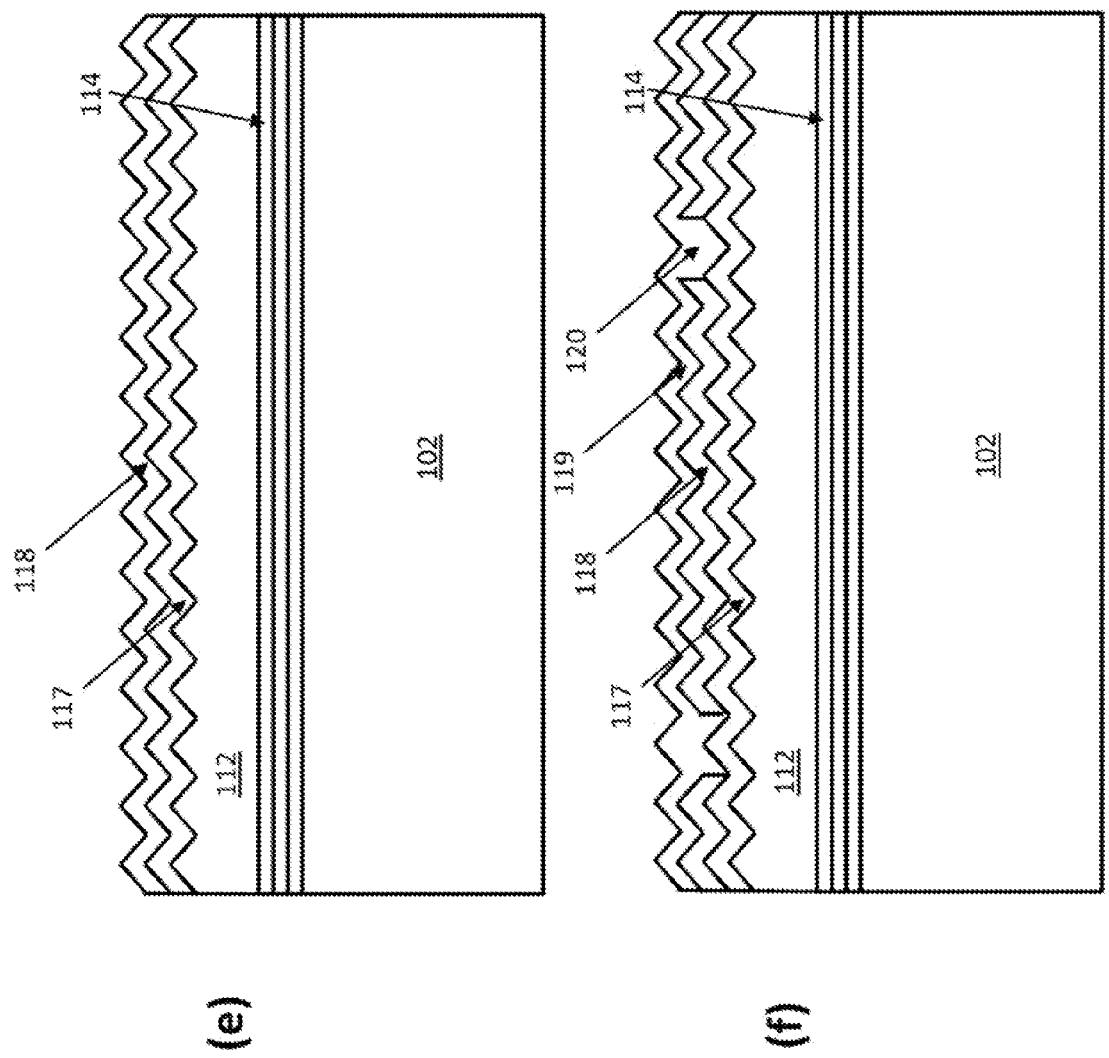
Figure 1:
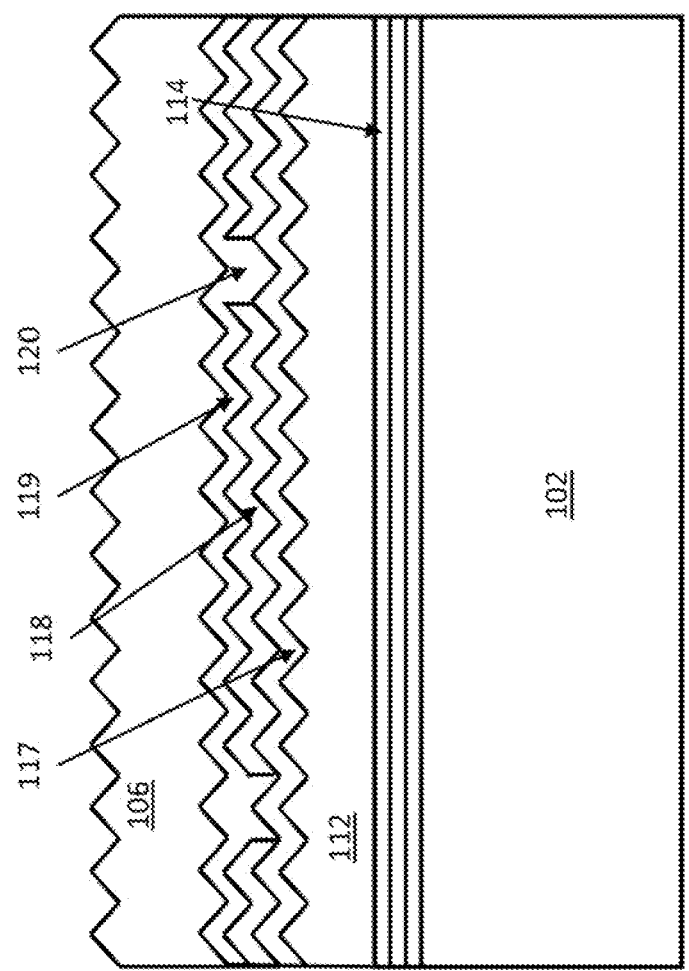
Figure 1:
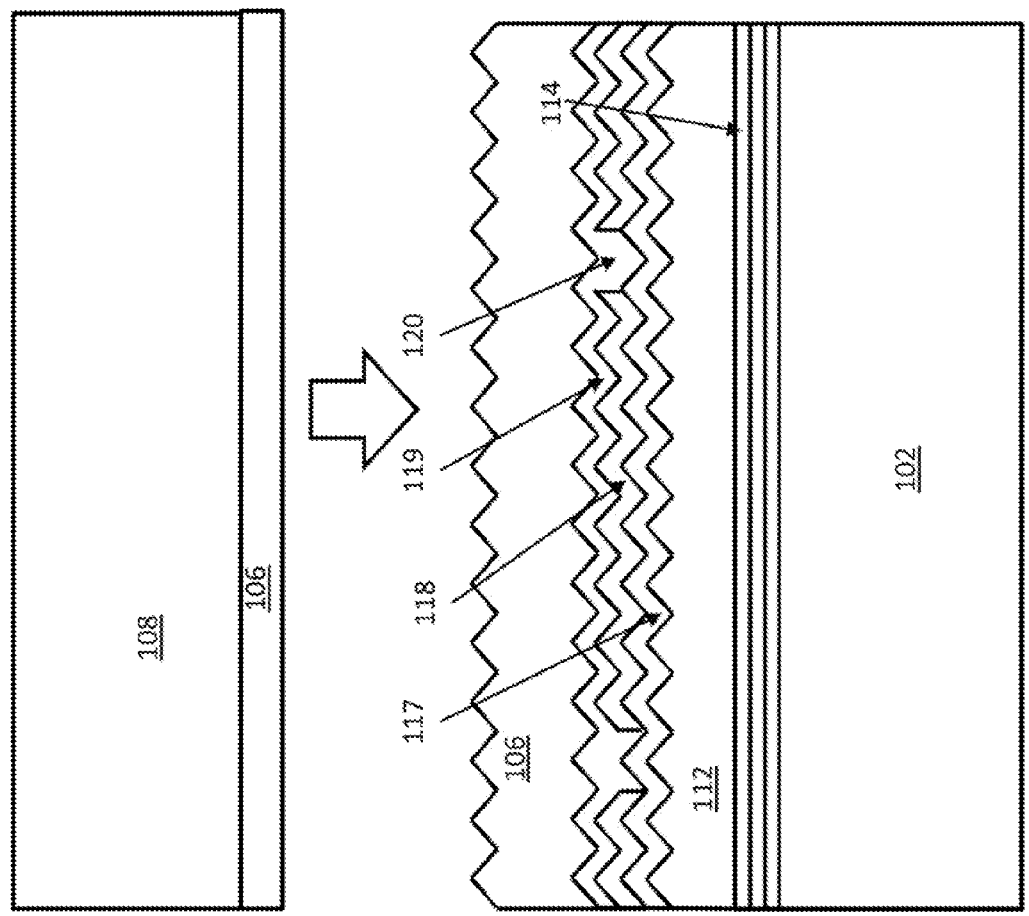
Figure 1:
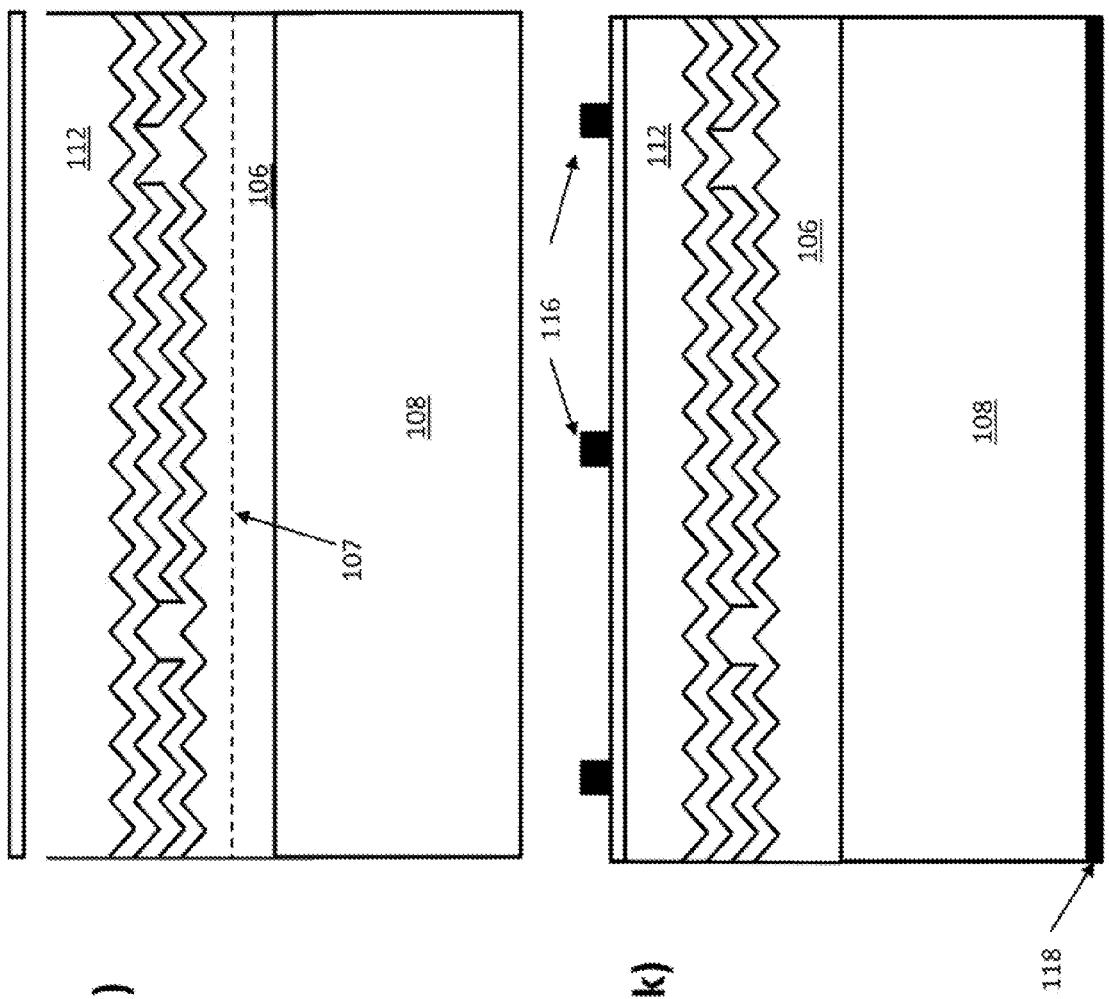

At present, the world photovoltaic market is dominated by solar cells made from free-standing crystalline silicon wafers, in two forms: multi-crystalline and monocrystalline. Of these, monocrystalline silicon enables higher performance cells, but is also the more expensive technology. Ultra-thin monocrystalline solar cells, with thickness well below 100 microns, may have at least two key advantages. First, silicon material usage is substantially less than for standard monocrystalline silicon solar cells, especially for the case of thin silicon fabrication techniques that avoid the kerf loss (sawing loss) of approximately 150 microns per silicon wafer produced. This alone could reduce monocrystalline silicon solar cell costs significantly. Second, thin monocrystalline silicon solar cells offer the benefit of lower recombination volume, leading to higher open circuit voltages (Voc) and consequently higher cell efficiencies, leading to lower cost per watt.

Despite these benefits, monocrystalline silicon solar cells with silicon thickness below 100 microns have not proved viable thus far. Free-standing silicon wafers below 100 microns may be considered too fragile to be processed with low-cost automated cell processing techniques. So far this approach has demonstrated limited success; typically the solar cell efficiencies are low, and typically non-standard and complicated cell processing techniques are required.

For thin monocrystalline silicon solar cells fabricated via layer transfer with conductive bonding layers, as described in U.S. patent application Ser. No. 13/009,844 entitled: "Monocrystalline Thin Cell" filed on Jan. 19, 2011, it may be beneficial for the conductive bonding layers to be a metal solder. There are multiple advantages. First, solder bonding layers are liquid at a bonding temperature, and thus can conform to topology or roughness on the micron scale. This may result in a bonding process (a) tolerant of small particles on the surface of one or both of the wafers to be bonded, which typically lead to macroscopic voids (non-bonded regions) when rigid bonding layers are used; (b) tolerant of roughness of the layers to be bonded, which may be crucial for a low cost photovoltaic application, given that a low cost carrier substrate may be rough on the micron scale due to the elimination of the expense of fine planarization; and (c) compatible with deliberate texturization of a surface of the solar cell to be bonded; such deliberate texturization may be performed to enhance the light trapping capability of the finished solar cell. Second, solder bonding layers allow for a very fast and strong bond to be formed. Third, solder bonding layers are compatible with formation of a rear reflector that will underlie the final thin film solar cell, boosting photon collection within the thin solar cell.

Solder bonding offers additional benefits for high efficiency multijunction solar cells based on III-V epitaxial layers grown on monocrystalline germanium substrates. These are the most efficient solar cells produced to date, but their high cost limits them to applications in concentrator photovoltaics, currently a niche market. Less expensive multijunction solar cells would enable broader adoption of this technology. Currently, the monocrystalline germanium substrate accounts for the majority of the cost of multijunction solar cells, even though only the top portion of this substrate contributes to solar cell operation. When combined with ion implantation to define a cleave plane in a monocrystalline germanium donor substrate, solder bonding enables transfer of thin monocrystalline germanium films to an inexpensive carrier substrate, reducing the cost of multijunction solar cells since the monocrystalline germanium donor substrate can be reused many times. Similar to the silicon transfer and solder bonding, there are multiple advantages, as previously described, that may be achieved with regard to transferring germanium layer and solder bonding.

Solder bonding can offer additional benefits for high efficiency single- or multi-junction photovoltaic cells that can be grown on monocrystalline GaAs substrates. For example, the most efficient single-junction solar cell produced to date was grown on a GaAs substrate (Brendan M. Kayes, Hui Nie, Rose Twist, Sylvia G. Spruytte, Frank Reinhardt, Isik C. Kizilyalli, and Gregg S. Higashi, IEEE PVSC conference 2011). However, the high cost of the GaAs substrate can limit application unless a high-yield method of reusing the GaAs substrate is found. When combined with ion implantation to define a cleave plane in a monocrystalline GaAs donor substrate, solder bonding enables transfer of a thin monocrystalline GaAs film to an inexpensive carrier substrate. This serves as the template for subsequent solar cell epitaxy. This reduces the cost of the single- or multi-junction solar cell, since the monocrystalline GaAs donor substrate can be reused many times. Similar to the silicon transfer and solder bonding, there are multiple advantages, as, previously described, that may be achieved with regard to transferring a GaAs layer and solder bonding.

Exemplary Solder Embodiment

Referring to FIGS. 1(a-k), an exemplary solar cell device is constructed in accordance with an exemplary solder bond embodiment of the invention. It should be noted that although the various embodiments disclosed herein relate to a solar device, embodiments of the invention are not limited to solar devices and may be used in the construction of various microelectronic and optoelectronic devices. A monocrystalline silicon donor substrate 102 may be used to construct a first portion of a solar cell and the porous region used later for separation. The donor substrate 102 may be, for example, but not limited to, a (100) or (111) surface orientation. The donor substrate 102 may have a thickness of about 150-1000 microns, for example. The diameter of the donor substrate 102 may be, but is not limited to, standard wafer sizes of about 100-300 mm. The donor substrate 102 may be doped p-type or n+ or alternately may be more lightly doped n-type if it is illuminated during porous silicon formation.

Porous Layer Formation

According to the exemplary embodiment, the donor substrate 102 may be p-type and have resistivity below about 1 ohm-cm. Dual porous layers 104 may be formed on the surface of the donor substrate 102. The top porous layer may have a lower porosity, to serve as a template for subsequent epitaxial growth. The bottom porous layer may have a higher porosity, to allow subsequent splitting. An exemplary approach to creating a splitting plane is known in the art and is described in, for example, Yonehara & Sakaguchi, JSAP Int. July 2001, No. 4, pp. 10-16. The porous layers 104 may also be stabilized via brief thermal oxidation and may also be sealed via anneal under $H_2$ as described in Yonehara & Sakaguchi.

Details of an exemplary process for forming porous Si splitting layers are as follow. A p-type (100)-oriented monocrystalline Si substrate, with resistivity between 0.01-0.02 ohm-cm, may be immersed in a solution composed of one part hydrofluoric acid, one part water, and one part iso-propyl alcohol. The substrate holder is electrically insulating, forcing electrical current to pass through the substrate and not around the wafer periphery. The substrate is in series and in-line with two silicon electrodes, one facing the front of the wafer and the other facing the back. The electrodes are equal to or greater than the diameter of the substrate and are separated from the substrate by a distance of at least 10% of the diameter of the substrate. Two different voltages are applied between the electrodes, resulting in the formation of two different porous silicon layers 104 at different current density. The first layer, which may be etched at a current density of 2-10 $mA/cm^2$ to a depth of 0.5-2 microns (etch time approximately 0.5-5 minutes), is low porosity (approximately 25%). The second layer, buried under the first layer and which may be etched at a current density of 40-200 $mA/cm^2$ to a depth of 0.25-2 microns (etch time approximately 2-30 seconds), is higher porosity. The second layer defines a cleave plane after subsequent cleaning, epitaxy, and bonding, described in further detail below. After etching, the wafers may be immersed in a mixture of sulfuric acid and hydrogen peroxide, self-heating to approximately 80-140° C., for 10 minutes. Other standard semiconductor cleaning solutions, such as SC-1, SC-2, hydrofluoric acid, hydrochloric acid, or iso-propyl alcohol, may also be used. Wafers may then be loaded into the silicon growth system.

Further Epitaxial Growth

Referring to FIG. 1b, a p-doped epitaxial silicon film 114 of thickness e.g 100-1000 nm with in-situ doping via e.g. boron to a level of greater than about 1018 $cm^{-3}$ may then be grown on top of the porous region using Atmospheric Pressure Chemical Vapor Deposition (APCVD) or Low Pressure Chemical Vapor Deposition (LPCVD), for example, with precursors such as dichloro-silane (DCS) or trichloro-silane (TCS), at temperatures above e.g. 900 C.

Processes for silicon epitaxy with in-situ doping are very well known in the art. A typical precursor used for p-type in-situ doping is diborane. This p-type region 114 may serve as the emitter of the solar cell. Methods of growing high quality epitaxial regions on porous silicon are well known in the art and may involve a step before epitaxial growth to seal the exposed surface pores, such as, for example, an anneal step under an $H^2$ ambient. Following this, an n-doped epitaxial film 112 of thickness e.g. 3-30 microns, with in-situ doping via e.g. arsenic or phosphorous to a level of $1\times10^{15}$ $cm^{-3}$-$1\times10^{17}$ $cm^{-3}$ may then be grown; this will serve as the base (absorber) region of the solar cell.

Texturing

Referring to FIG. 1c, the exposed surface of epitaxial film 112 may be etched to form textured surface 111, to improve the light trapping capability of the solar cell. This texturization may be via a wet etch in NaOH, KOH, or TMAH as described in http://www.pveducation.org/pvcdrom/manufacturing/texturing, or by other means such as plasma etching, or sand blasting. The peak-to-valley depth of the textured surface may be on the order of e.g. 100 nanometers-5 microns. While the texturization is illustrated in FIG. 1c and subsequently as fully regular, the texturization is more typically partially or fully random. For example, for a surface with pyramidal texturing, the size of the pyramids may vary significantly.

Back Surface Doping

Referring to FIG. 1d, an n-type silicon layer 117 more heavily doped than base region 112 may be formed on surface 111 by diffusion, using standard processes; e.g., with a $POCl_3$ diffusion source. The thickness of this layer could be e.g. 0.1-1 microns, while the doping can be between $10^{17}$-$10^{19}$ $cm^{-3}$. This layer may function as the base contact region (also called the back surface field region) of the solar cell subsequent to layer transfer (described below).

Rear Surface Passivation

Referring to FIG. 1e, a passivation layer 118 is disposed upon the surface of n-type silicon layer 117. Passivation layer 118 may be any of the standard films used to passivate silicon solar cells, such as amorphous silicon (a-Si), silicon nitride ($SiN_x$), silicon dioxide ($SiO_2$), or aluminum oxide ($Al_2O_3$). Passivation layer 118 may be deposited via common methods such as plasma-enhanced chemical vapor deposition (PECVD), atomic layer deposition (ALD), or, in the case of $SiO_2$, thermal oxidation of n-type silicon layer 117.

Rear Surface Contacting

Referring to FIG. 1f, a contact layer 119 is disposed on passivation layer 118. Contact layer may comprise silver (Ag) or copper (Cu) and may be deposited via standard methods such as evaporation, sputtering, screen printing, or plating. In cases where passivation layer 119 is electrically insulating, contact layer 119 may need to penetrate a portion of passivation layer 118 to achieve electrical contact to the solar cell. This may be achieved by either of two methods: (a) patterning passivation layer 118 (e.g. through photolithography) prior to contact layer deposition to provide openings 120 for contact layer 119 to contact n-type silicon layer 117; or (b) firing of contact layer 119 through passivation layer 118 through methods such as laser annealing (not pictured) as described in, for example, E. Schneiderlöchner, R. Preu, R. Lüdemann, and S. W. Glunz, "Laser-Fired Rear Contacts for Crystalline Silicon Solar Cells," Progress in Photovoltaics: Research and Applications 20 (2002) 29.

Bonding Layer Deposition on Donor

Referring to FIG. 1g, conductive metal bonding layers 106 may be deposited on the surface of the donor substrate and solar cell portion. In one embodiment, bonding layers 106 may be comprised of a thin layer to promote adhesion (e.g. 10-50 nm thick) followed by a thicker layer of a low-melting-point metal (e.g. 0.5-5 microns thick). For example, the thin layer to promote adhesion may be Cr or Ti, and the thicker layer of low-melting-point metal may be Sn or In. These layers may be deposited by processes well known in the art such as, but not limited to, thermal evaporation, sputtering, electrodeposition, or screen printing. The deposition may be performed such that there is no exposure to an oxygen-containing ambient between the depositions of different metal layers, to prevent native oxide formation between the different metal layers.

Carrier Substrate Preparation

Referring to FIG. 1h, the donor substrate 102, including the first portion of a solar cell, may be bonded to a carrier substrate 108. The carrier substrate 108 may be, for example, inexpensive metallurgical grade silicon, or a metal such as steel or a low-CTE iron-nickel alloy such as Kovar™ or Invar™, or a conductive ceramic such as polycrystalline aluminum titanium nitride, or other suitable material. The carrier substrate 108 may be of the same or a similar size as the donor substrate 102, or it may be larger such as to support multiple solar cells. The carrier substrate 108 may be rigid with a thickness in the range of e.g. 100-500 microns. Alternatively, the carrier substrate 108 may be flexible; for example, it may be a steel foil of thickness e.g. below 100 microns. The carrier substrate 108 may be electrically conductive. The Coefficient of Thermal Expansion (CTE) of the carrier substrate 108 may be approximately matched to that of donor substrate 102, to allow for subsequent thermal processing steps necessary to form the solar cell, without giving rise to excessive stress in the donor solar cell regions due to a mismatch between the CTE of the donor substrate and that of the carrier substrate. For example, the CTE of the carrier substrate 108 may be less than about 6-10 ppm/° K. at room temperature. The carrier substrate 108 may have a peak-to-valley surface roughness of e.g. less than 2 microns, and a low local micro-roughness (preferably <1.0 micron root-mean-square roughness). Conductive metal bonding layers 106 may be deposited on the surface of the carrier substrate 108. In one embodiment, bonding layers 106 may be comprised of a thin layer to promote adhesion (e.g. 10-50 nm thick) followed by a thicker layer of a low-melting-point metal (e.g. 0.5-5 microns thick). For example, the thin layer (between the low temperature metal and the carrier substrate) to promote adhesion may be Cr or Ti, and the thicker layer of low-melting-point metal may be Sn or In, or a Sn- or In-containing solder alloy. These layers may be deposited by processes known in the art such as, but not limited to, thermal evaporation, sputtering, electrodeposition, or screen printing. The deposition may be performed such that there is no exposure to an oxygen-containing ambient between the depositions of different metal layers, to prevent native oxide formation between the different metal layers.

Bonding

The wafer bonding can be achieved in a tool such as an EVG (Electronic Visions Group) 510 bonder, or a SUSS SB6e bonder. In one embodiment, the donor wafer and carrier wafer are approximately the same size, and are brought substantially into alignment prior to contact, e.g. with not more than 1 mm lateral offset, within the bonding tool. Wafers may be brought into contact in a closed bonding chamber, in an ambient of e.g. nitrogen or air at a background pressure of e.g. 0.01-0.1 atm. After wafers are brought into contact a force of e.g. 0.1-1 MPa may be applied. While this force is maintained the contacted wafer pair may be brought to a peak temperature above the melting point of the low-melting-point metal. For example, this temperature may be 232-300° C. if the low-melting-point metal is Sn. This temperature may be maintained only briefly, e.g. 1-30 seconds. While the low-melting-point metal is in a liquid phase, it may conform to any non-planar topology at the bonded interface arising from (a) surface roughness of the donor or carrier wafer, (b) particles at the bonding interface, or (c) surface texturization, provided that such topology is thinner than the combined thickness of the low-melting-point metal layers on one or both of the donor and carrier wafer. After the wafer pair cools substantially below the melting point of the low-melting-point metal, the now-bonded wafer pair contains bonded interface 107, which may be substantially planar.

Cleaving

Referring to FIG. 1i, the donor substrate 102 may be removed from the first portion of a solar cell bonded to the carrier substrate 108 by cleaving the donor substrate 102 within the porous layers 104. Separation may be via mechanical force alone, or enhanced with various other methods. For example, a wedged device (not shown) may be applied to induce separation at the exposed external edges of the porous region 104. In another example, separation may be enhanced via application of a high pressure water jet directed at the edge of the porous silicon layers 104, as described in Yonehara & Sakaguchi. In yet another example, a wet acid solution, such as HF/H202, may also be exposed to the porous region 104 to erode the porous region 104 from the edge and enhance separation. In yet another example, for the case of a carrier substrate 108 with a CTE different than that of the silicon donor substrate 102, a thermal anneal may be used to induce stress in the bonded wafer pair, leading to separation within the porous Si layers 104 to relieve the stress. It should be understood that the above examples of separation may be used individually or in various combinations.

Topside Processing

Referring to FIG. 1j, once the carrier substrate 108 and solar cell portion have been removed from the donor substrate 102, various post-separation processing of the solar cell portion and/or additional construction of a second portion of the solar cell may occur on the solar cell portion coupled to the carrier substrate 108. The subsequent diagrams are also flipped vertically from previous diagrams with the bonding interface no longer illustrated. Optionally, the porous layer 104 of the portion of the solar cell may be removed with wet acid etch as described in Yonehara & Sakaguchi, or in Nobuhiko Sato et al, Journal of the Electrochemical Society, v. 142 n.9 p. 3116-22, or via an etch in a KOH (Potassium hydroxide) solution, or via polishing. For example, porous layer 104 may be removed in a KOH solution of concentration 45% via immersion for e.g 30-90 minutes at room temperature. Alternately, it may be advantageous to leave some or the entire porous layer 104 intact, as the porous surface's roughness may enhance light capture by the solar cell. The top surface solar cell processing may also include surface roughening (not shown), surface passivation, and deposition of anti-reflection coatings (not shown), all well-known in the art of solar cell manufacturing. Also after splitting, the donor substrates 102 may be processed for reuse in the next wafer production cycle. This processing may include polishing, wet etching, or otherwise cleaning of the cleaved surface for subsequent formation of porous layers in future wafer production cycles. For example, this processing may include the removal of porous layer 104, via immersion in a KOH solution of concentration 45% for e.g 30-90 minutes at room temperature.

Referring to FIG. 1k, metal contact lines 116 may be constructed on the surface of the solar cell, for example, via screen printing. A metal coating 118 on the back of the carrier substrate 108 may also be used to enhance electrical connection to the carrier substrate 108, and thus through the carrier substrate 108 to the solar cell p+ emitter region 110. This coating may be deposited using, for example, but not limited to, screen printing, evaporation, sputtering, or electro-/electroless-plating. After application of one or both of metal contact materials 116 and 118, the structure may be annealed at a temperature of e.g. 100-300° C. This anneal may be performed in an ambient of e.g. forming gas.

Completed Solar Cell

Figure 2:
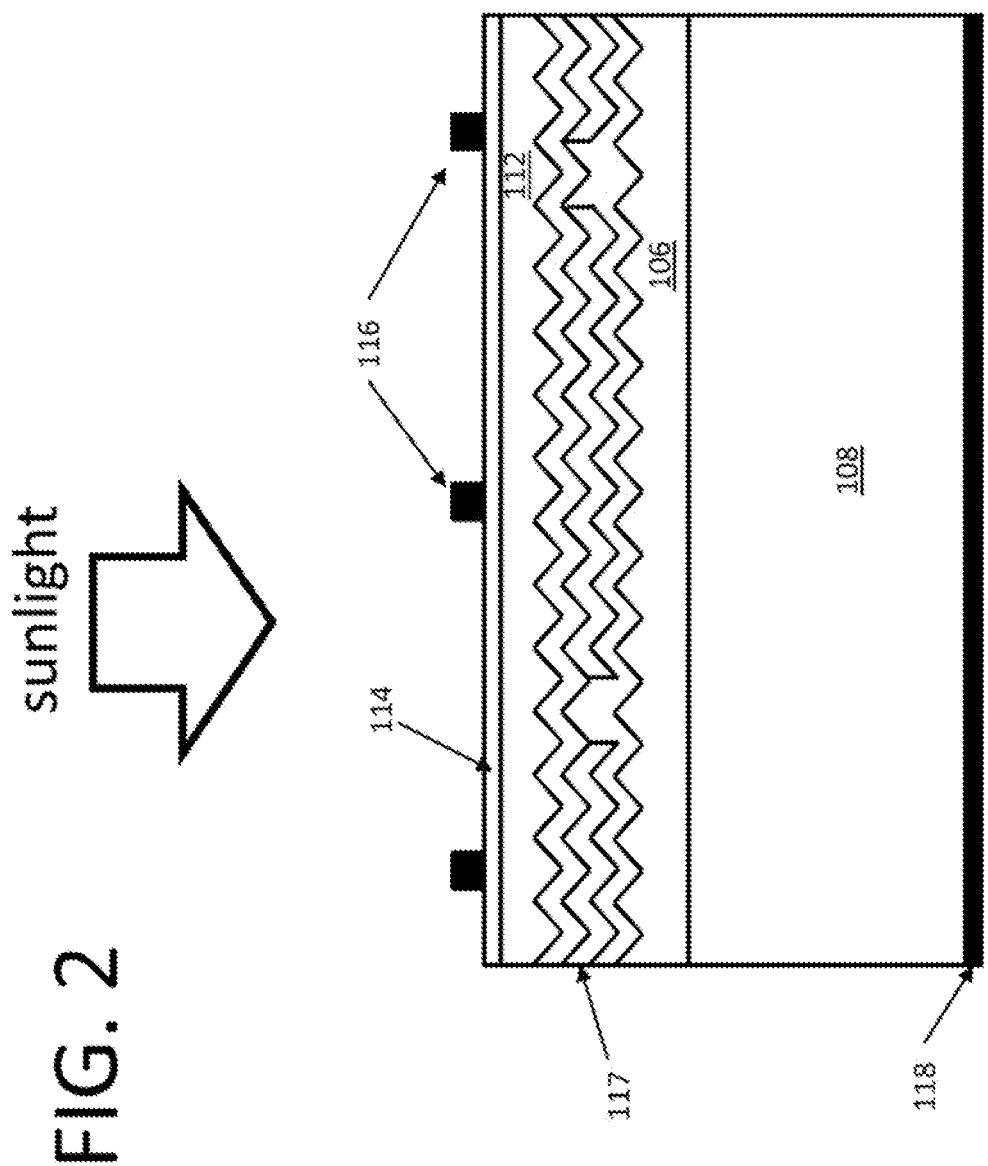
FIG. 2 is a profile diagram of a completed device in accordance with the exemplary solder bonding embodiment of the invention.

Referring to FIG. 2, the cell on the carrier substrate 108 may have the exemplary basic cell structure. N-type epitaxially grown silicon 112 may provide the solar cell base region. P+ epitaxially grown region 114 may provide the solar cell emitter region. Buried conductive layers 106 may provide bottom electrical contact to the n+ base contact region 117. Conductive layers 106 may provide light reflection for more complete light absorption in the base region. Because the interface between the silicon and the conductive layers 106 below has been textured, extremely effective light trapping can result due to the re-direction of the reflected light. Re-direction of the light away from a direction substantially normal to the top solar cell surface promotes total internal reflection, as described for Lambertian rear reflectors in http://www.pveducation.org/pvcdrom/design/lambertian-rear-reclectors.

This thin silicon cell approach may allow the high electrical conversion efficiency typical of bulk monocrystalline silicon solar cells (where whole silicon wafers of e.g. 150 micron thickness or more are used to form the solar cell) but with significant cost savings because of the dramatically reduced usage of the relatively expensive high-quality monocrystalline silicon. This advantage may be realized through the re-use multiple times of the relatively expensive monocrystalline silicon donor wafer 102. Another advantage of this structure may be a high open circuit voltage, due to the low recombination volume of the thin base region, leading to higher cell efficiency.

In an alternative embodiment, the configuration of the base and emitter can be reversed, so that in the deployed cell the n+ base contact region is facing the sun, and the p+ emitter is beneath the base region (away from the sun). In this case, referring to FIG. 2, the cell on the carrier substrate 108 may have an n-type epitaxially grown silicon base region 112; a n+ epitaxially grown region 114 may provide the base contact region. Buried conductive layers 106 provide bottom electrical contact to the p+ emitter region 117. Referring to FIG. 1d the p+ silicon emitter layer 117, doped to a level>1e18 cm$^{-2}$, may be formed on surface 111 by diffusion, using standard processes; e.g., with a diborane diffusion source. Alternatively, p+ silicon emitter layer 117, doped to a level>1e18 cm-2, may be formed on surface 111 by deposition of aluminum on surface 111, e.g. via screen-printing, evaporation, sputtering, or other methods common in the art; followed by an anneal of e.g. 600-900° C. for a time from e.g. 1-60 minutes. This anneal step alloys a portion of the Si and with at least a portion of the Al layer. Al in Si is a p-type dopant; thus, the p+ emitter layer is formed.

In yet another alternative embodiment, the doping types can be reversed, so that the base region is p-type, the emitter region is n+, and the base contact region is p+. For this embodiment, the cell may be configured such that the emitter is on the upper surface of the solar cell (facing the sunlight) and the base contact region is below the base and in proximity to the conductive bonding layers. Alternatively, the cell may be configured such that the base contact region is on the upper surface of the solar cell (facing the sun) and the emitter region is below the base and in proximity to the conductive bonding layers. In the latter embodiment, where the emitter region is below the base region, alloyed silicon-aluminum layers could be utilized to create the p-type emitter region (replacing the p-type epitaxial silicon emitter 114). In this embodiment, n+ front surface field and n-type base regions are grown on porous layers 104, cell texturing is performed, and aluminum is deposited on surface 111. The aluminum is then alloyed with the silicon to simultaneously create a heavily doped p+ emitter and a back contact. Wafer bonding and solar cell processing then proceeds as shown in FIG. 1(f-j) and with a cell structure similar to FIG. 2, leaving the aluminum-doped emitter at the rear of the cell and the n+ front surface field at the front.

After topside wiring for cell interconnect, the cells and/or carrier substrate may be covered with a protective polymer film such as EVA—not shown. It should be noted that the solar cell structure is for illustrative purposes and the invention is not limited to the disclosed structure. Various devices may be constructed and materials can be deposited by a variety of techniques, including thermal or e-beam evaporation, DC or RF sputtering, electroplating, molecular beam epitaxy (MBE), atomic layer deposition (ALD), pulsed-laser deposition (PLD), spin coating, MOCVD, HVPE, liquid phase epitaxy (LPE), screen printing, or any other suitable technique. Materials can be annealed or undergo chemical reactions following deposition, or after additional materials or reactants are deposited or placed in proximity.

Exemplary Method of Construction

Figure 3:
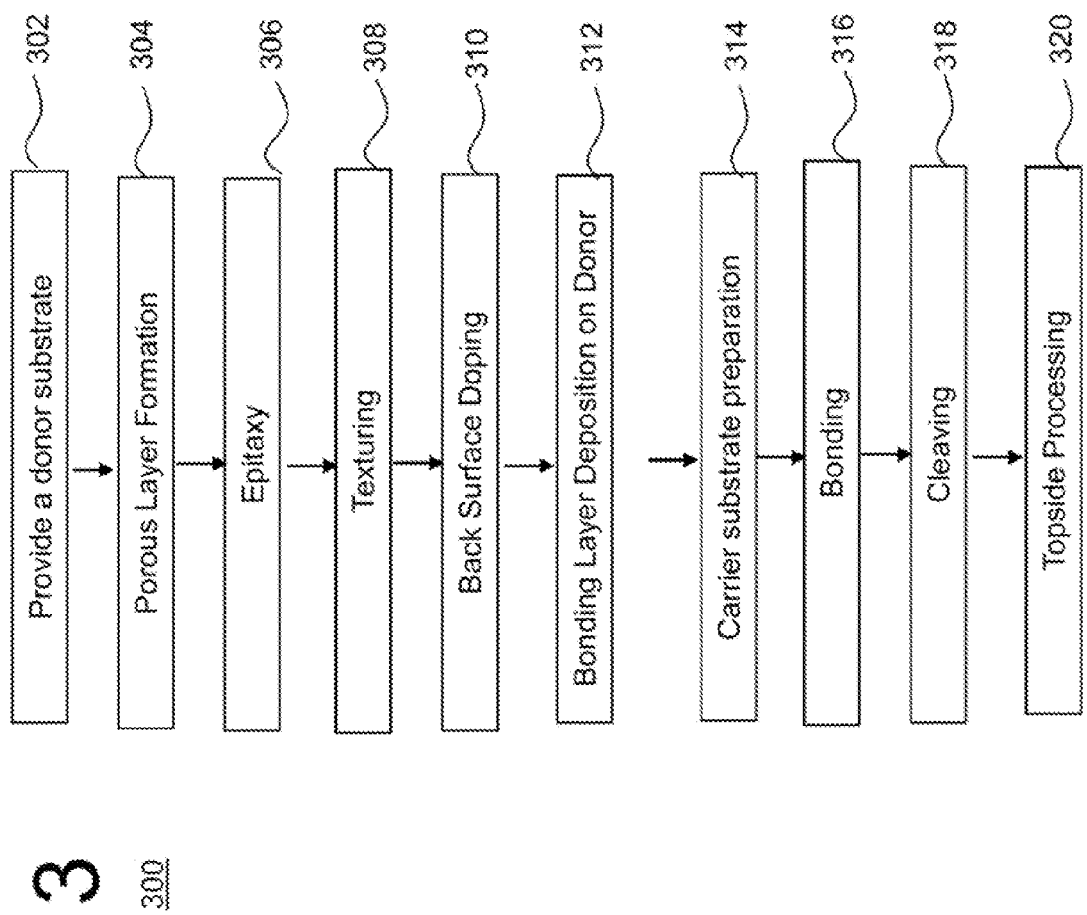
FIG. 3 is a flow chart of exemplary actions used to construct a device in accordance with the exemplary solder bonding embodiment of the invention.

Referring to FIG. 3, construction of the exemplary solder bond device 300 may include the following actions. The donor substrate as previously described is provided (block 302). One or more porous layers are formed on the donor substrate (block 304). A solar cell or device is constructed or partially constructed on top of the porous layer of the donor substrate by, for example, epitaxial growth (block 306), texturing (block 308), and/or back surface doping (block 310) or other steps previously described. A solder bonding layer is deposited on the donor substrate (block 312). The carrier substrate is prepared by, for example, also depositing a solder bonding layer (block 314). The solar cell or device and donor substrate are solder bonded to the carrier substrate (block 316). The solar cell or device and carrier substrate are removed from the donor substrate by cleaving processes as previously described (block 318). The solar cell or device is processed further to completion (block 320) and the separated donor substrates may be processed for recycling. The exemplary method of construction may be modified to incorporate other embodiment, for example, but not limited to actions associated with rear surface passivation and contacting as described in previous embodiments.

Exemplary Solder Embodiment

Figure 4:
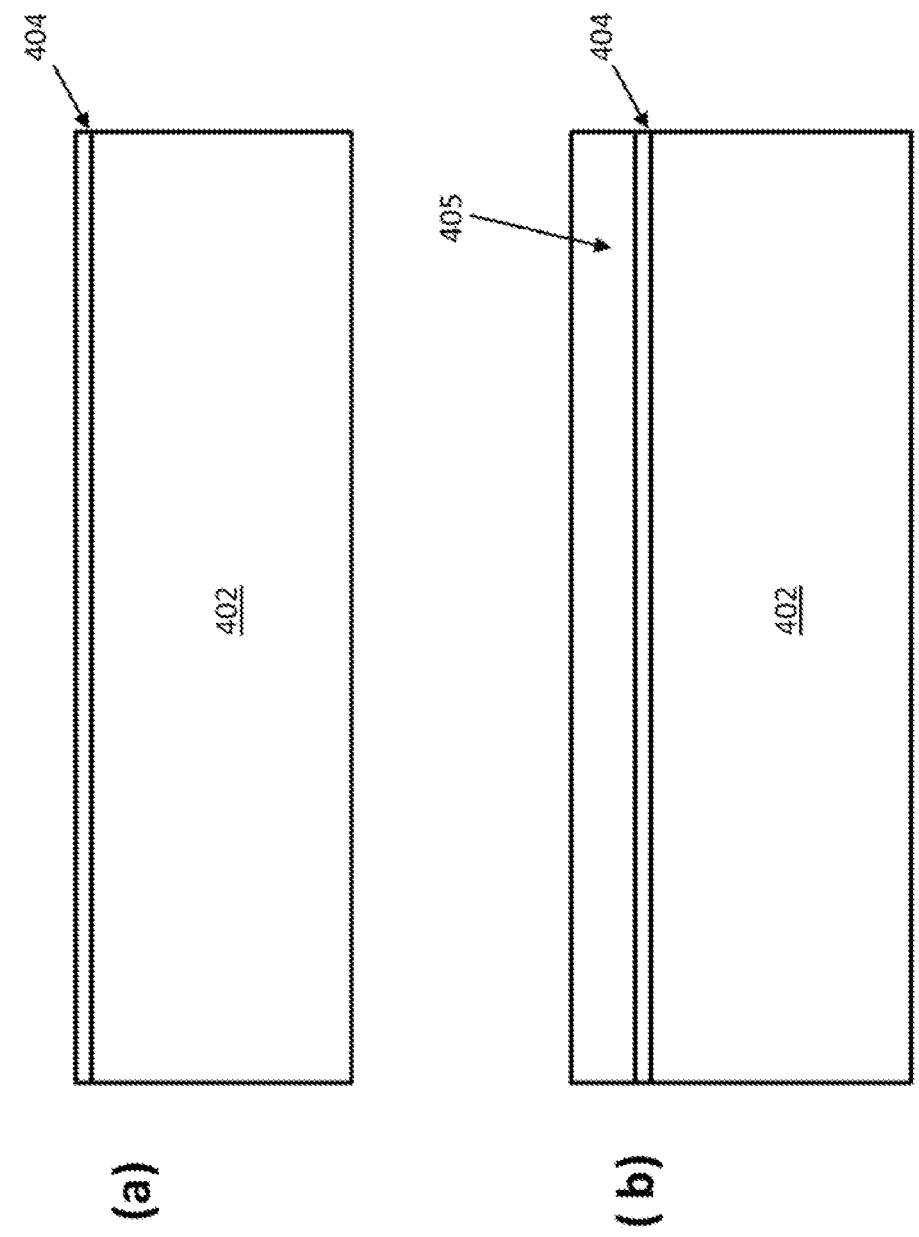
FIGS. 4(a-f) are profile diagrams of a device with germanium layer transfer constructed in accordance with an exemplary solder bonding embodiment of the invention.
Figure 4:
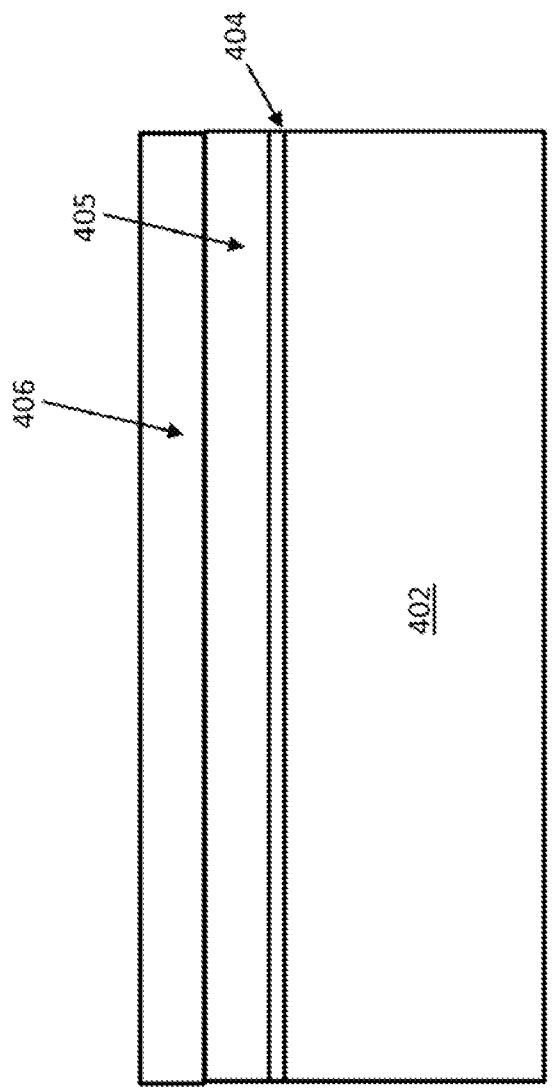
Figure 4:
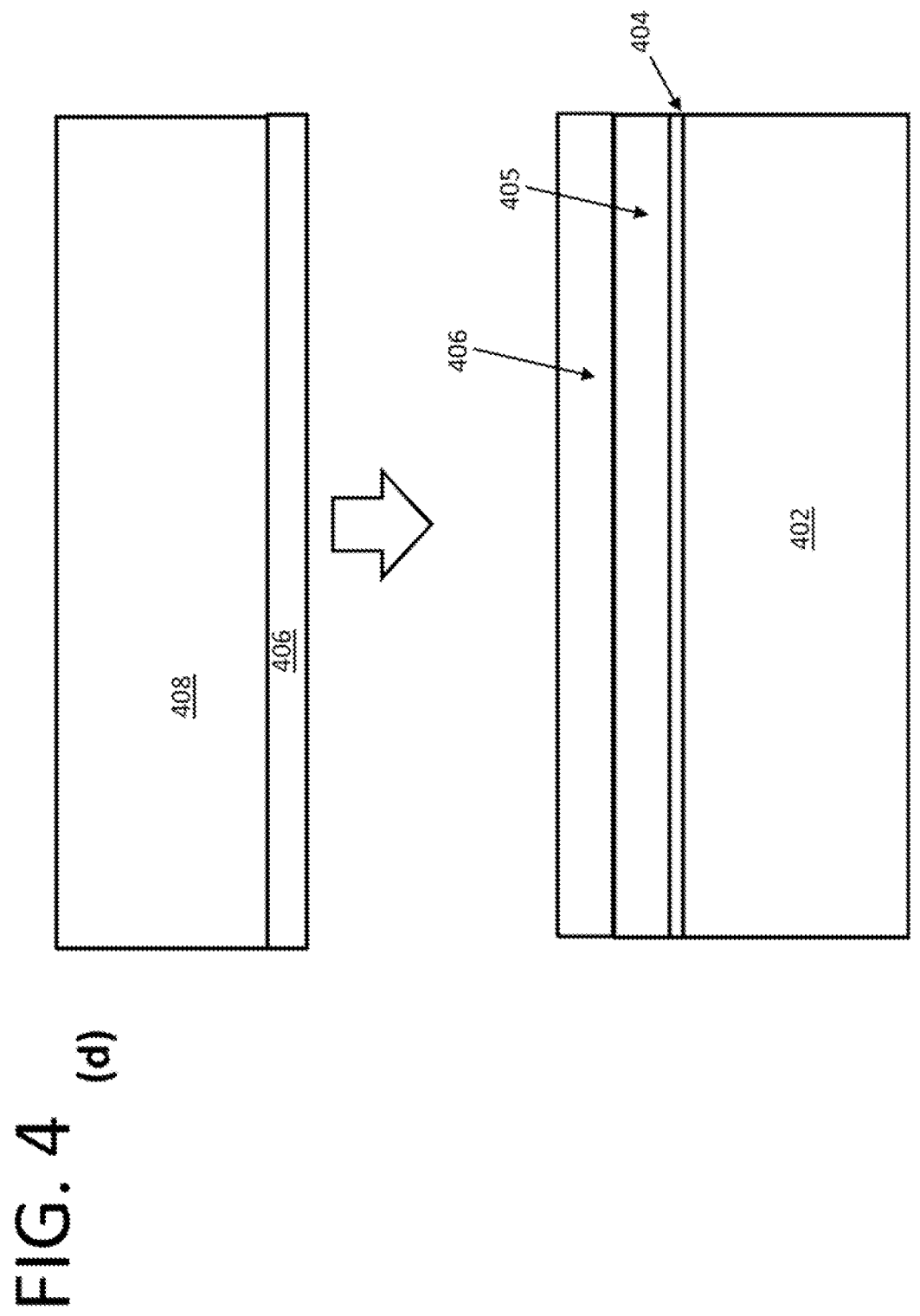
Figure 4:
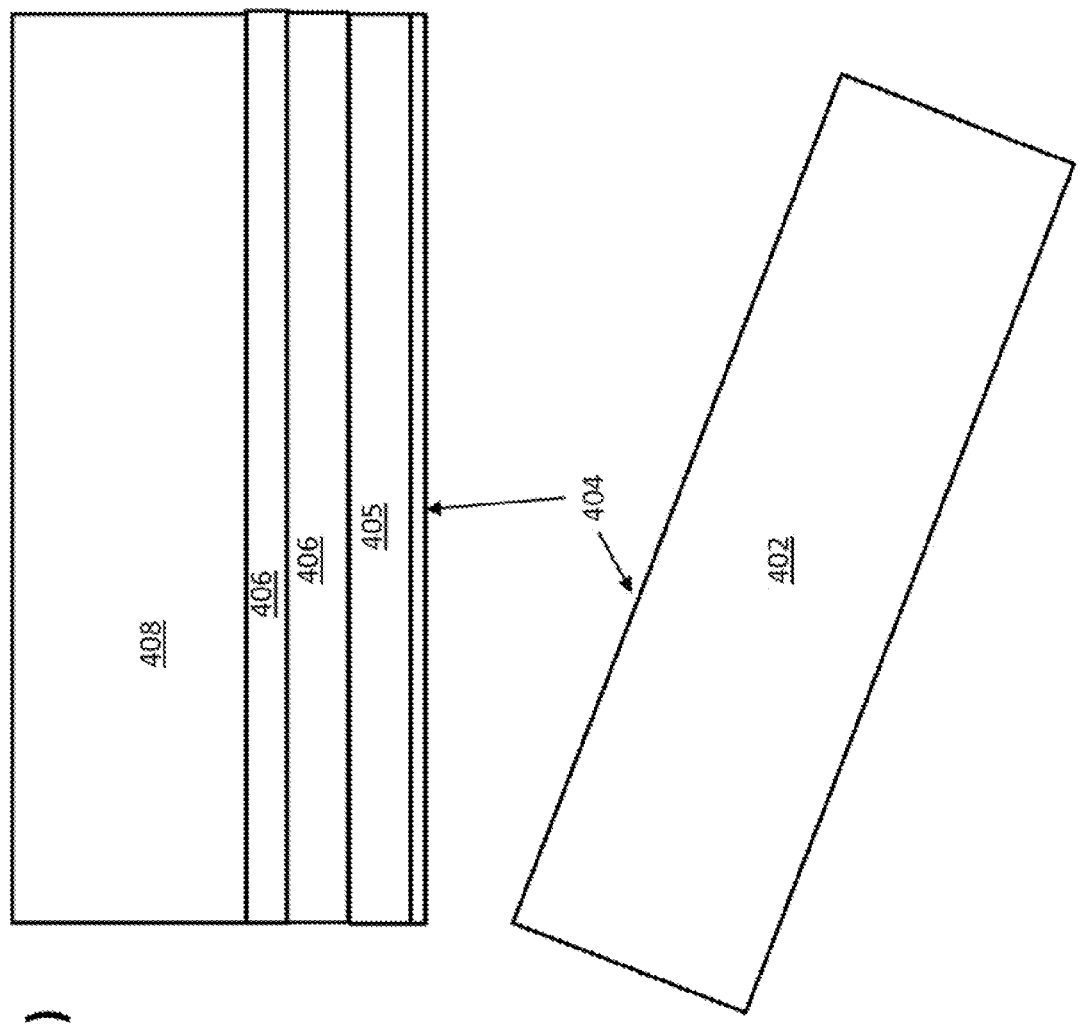
Figure 4:
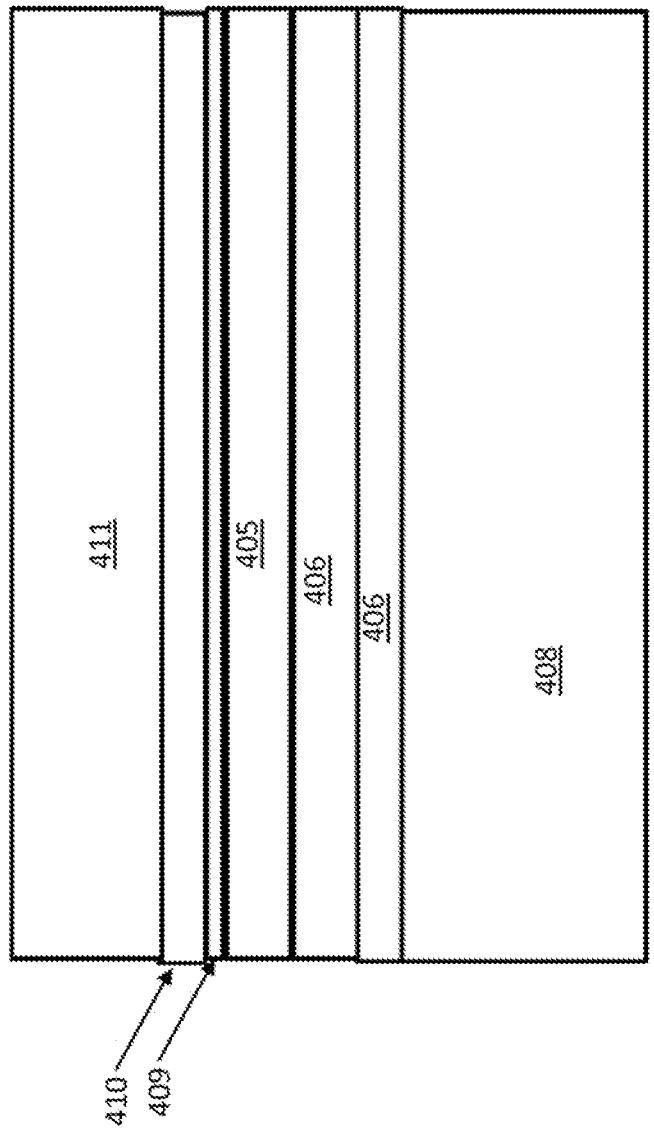

Referring to FIGS. 4(a-f), an exemplary solar cell device is constructed in accordance with an exemplary solder bond embodiment of the invention. It should be noted that although the various embodiments disclosed herein relate to a solar device, embodiments of the invention are not limited to solar devices and may be used in the construction of various microelectronic and optoelectronic devices. A monocrystalline germanium donor substrate 402 may be used to construct a first portion of a solar cell and the cleave plane used later for separation. The donor substrate 402 may be, for example, but not limited to, a (100) or (111) surface orientation. The donor substrate 402 is not limited to germanium and may be, for example, but not limited to GaAs or InP. The donor substrate 402 may have a thickness of about 150-1000 microns, for example. The diameter of the donor substrate 402 may be, but is not limited to, standard wafer sizes of about 50-200 mm.

Cleave Plane Formation

Referring to FIG. 4a, according to the exemplary embodiment, the donor substrate 402 may be implanted with a high dose of hydrogen (in the form of H or $H_2$) and/or helium atoms; e.g. $10^{16}$-$2\times10^{17}$ ions/cm$^2$ to define a cleave plane 404. More specifically, the implant could be of $H_2$ with a implant dosage of about $2\times10^{16}$ to $5\times10^{16}$/cm$^2$. The implant energy defines the depth of the cleave plane 604 and may be, e.g., 100-1000 keV. Other implant species such as boron, either singly or in combination with the above, may be useful as well.

Diffusion Barrier Deposition

Referring to FIG. 4b, a diffusion barrier 405 is disposed on the surface of donor substrate 402. Diffusion barrier 405 is preferably electrically conductive, and examples include silicon, titanium nitride, tantalum nitride, zirconium nitride, tungsten, and titanium-tungsten. Diffusion barrier 405 may need to be sufficiently thick and dense to block diffusion of impurities during subsequent process steps from the bonding layers and carrier substrate into the transferred germanium layer.

Bonding Layer Deposition on Donor

Referring to FIG. 4c, conductive metal bonding layers 406 may be deposited on the surface of the diffusion barrier 405. In one embodiment, bonding layers 406 may be comprised of a thin layer to promote adhesion (e.g. 10-50 nm thick) followed by a thicker layer of a low-melting-point metal (e.g. 0.5-5 microns thick). For example, the thin layer to promote adhesion may be Cr or Ti, and the thicker layer of low-melting-point metal may be Sn or In. These layers may be deposited by processes well known in the art such as, but not limited to, thermal evaporation, sputtering, electrodeposition, or screen printing. The deposition may be performed such that there is no exposure to an oxygen-containing ambient between the depositions of different metal layers, to prevent native oxide formation between the different metal layers.

Carrier Substrate Preparation

Referring to FIG. 4d, the donor substrate 402, including the first portion of a solar cell, may be bonded to a carrier substrate 408. The carrier substrate 408 may be, for example, a metal such as steel or a low-CTE iron-nickel alloy such as Kovar™, Invar™, molybdenum, or tungsten, or a conductive ceramic such as polycrystalline aluminum titanium nitride, or other suitable material. The carrier substrate 408 may be of the same or a similar size as the donor substrate 402, or it may be larger such as to support multiple solar cells. The carrier substrate 408 may be rigid with a thickness in the range of e.g. 100-500 microns. Alternatively, the carrier substrate 408 may be flexible; for example, it may be a steel foil of thickness e.g. below 100 microns. The carrier substrate 408 may be electrically conductive. The CTE of the carrier substrate may be approximately matched to that of germanium, to allow for subsequent thermal processing steps necessary to form the solar cell, without giving rise to excessive stress in the silicon solar cell regions due to a mismatch between the CTE of germanium and that of the carrier substrate. For example, the CTE of the carrier substrate 408 may be less than about 6-12 ppm/° K. at room temperature. The carrier substrate 408 may have a peak-to-valley surface roughness of e.g. less than 2 microns, and a low local micro-roughness (preferably <1.0 micron root-mean-square roughness). Conductive metal bonding layers 406 may be deposited on the surface of the carrier substrate 408. In one embodiment, bonding layers 406 may be comprised of a thin layer to promote adhesion (e.g. 10-50 nm thick) followed by a thicker layer of a low-melting-point metal (e.g. 0.5-5 microns thick). For example, the thin layer to promote adhesion may be Cr or Ti, and the thicker layer of low-melting-point metal may be Sn or In, or a Sn- or In-containing solder alloy. These layers may be deposited by processes known in the art such as, but not limited to, thermal evaporation, sputtering, electrodeposition, or screen printing. The deposition may be performed such that there is no exposure to an oxygen-containing ambient between the depositions of different metal layers, to prevent native oxide formation between the different metal layers.

Bonding

The wafer bonding can be achieved in a tool such as an EVG (Electronic Visions Group) 510 bonder, or a SUSS SB6e bonder. In one embodiment, the donor wafer and carrier wafer are approximately the same size, and are brought substantially into alignment prior to contact, e.g. with not more than 1 mm lateral offset, within the bonding tool. Wafers may be brought into contact in a closed bonding chamber, in an ambient of e.g. nitrogen or air at a background pressure of e.g. 0.01-1 atm. After wafers are brought into contact a force of e.g. 0.1-1 MPa may be applied. While this force is maintained the contacted wafer pair may be brought to a peak temperature above the melting point of the low-melting-point metal. For example, this temperature may be 232-300° C. if the low-melting-point metal is Sn. This temperature may be maintained only briefly, e.g. 1-30 seconds. While the low-melting-point metal is in a liquid phase, it may conform to any non-planar topology at the bonded interface arising from (a) surface roughness of the donor or carrier wafer, (b) particles at the bonding interface, or (c) surface texturization, provided that such topology is thinner than the combined thickness of the low-melting-point metal layers on one or both of the donor and carrier wafer.

Cleaving

Referring to FIG. 4e, the donor substrate 402 may be removed from the first portion of a solar cell bonded to the carrier substrate 408 by exposing the donor substrate 402 to a sufficiently high temperature to induce exfoliation at the cleave plane. For example, this temperature may be above 200 C. More specifically, it may be in the range of 300 C-400 C.

Further Processing

Referring to FIG. 4f, once the carrier substrate 408 and solar cell portion have been removed from the donor substrate 402, various post-separation processing of the solar cell portion and/or additional construction of a second portion of the solar cell may occur on the solar cell portion coupled to the carrier substrate 408. The subsequent diagrams are also flipped vertically from previous diagrams with the bonding interface no longer illustrated. Optionally, the residual exfoliated layers 404 of the portion of the solar cell may be removed with wet acid etch or polishing. Next, epitaxial growth of Ge and/or III-V layers is performed, resulting in a multijunction solar cell connected by tunnel junctions as described in, for example, R. R. King, D. C. Law, K. M. Edmondson, C. M. Fetzer, G. S. Kinsey, H. Yoon, R. A. Sherif, and N. H. Karam, "40" Efficient Metamorphic GaInP/GaInAs/Ge Multijunction Solar Cells," Applied Physics Letters 90 (2007) 183516. Finally, top surface solar cell processing may include deposition of anti-reflection coatings (not shown) and formation of metal contact lines, all well-known in the art of solar cell manufacturing. Also after splitting, the donor substrates 402 may be processed for reuse in the next wafer production cycle. This processing may include polishing, wet etching, or otherwise cleaning of the cleaved surface for subsequent formation of cleave planes in future wafer production cycles.

Completed Solar Cell

Referring to FIG. 4f, the cell on the carrier substrate 408 may have the exemplary basic cell structure. P-type germanium 409 is bonded to carrier substrate 408 via solder bonding. N-type germanium 410 is formed via diffusion, defining the bottom junction of the solar cell. Diffusion may occur in-situ within the MOCVD chamber by introduction of dopants such as phosphorus or arsenic. Next, III-V epitaxial layers 411, incorporating tunnel junctions connecting one or more III-V junctions to the bottom junction. III-V epitaxial layers may include alloys of Al, In, Ga, As, P, and N.

It should be noted that the solar cell structure is for illustrative purposes and the invention is not limited to the disclosed structure. Various devices may be constructed and materials can be deposited by a variety of techniques, including thermal or e-beam evaporation, DC or RF sputtering, electroplating, molecular beam epitaxy (MBE), atomic layer deposition (ALD), pulsed-laser deposition (PLD), spin coating, MOCVD, HVPE, liquid phase epitaxy (LPE), screen printing, or any other suitable technique. Materials can be annealed or undergo chemical reactions following deposition, or after additional materials or reactants are deposited or placed in proximity.

Exemplary Transient Liquid Phase (TLP) Bonding Embodiment

Solder bonding as described in the previous embodiments may possibly limit final solar cell efficiency by constraining the thermal budget of the solar cell process after layer transfer. For example, if a pure Sn solder were to be used for the bonding layer, any post-layer-transfer processing step above the melting point of Sn may not be permissible due to the liquid Sn attacking and/or compromising the integrity of the overlying silicon layer. This in turn could limit the quality of, for example, contacts to the solar cell, preventing a contact anneal (after deposition of the top contact metals(s) that would be sufficient to result in a low-resistance contact. While some technologies allow contact anneals as low as 200° C., most mainstream cell processing contact anneals are much higher, and well above the melting point of common solders.

A solution may be to replace the solder bonding process with a TLP (Transient Liquid Phase) bonding process. In this process, at least two metals are utilized in the bonding process. With respect to FIG. 5a, surface metal layers 500 are low-melting-point metals such as Sn or In, and form the surfaces to be bonded. Metal underlayers 510, lying between the top metal layers and the substrates to be bonded 520, have a higher melting point, and are for example Ni or Cu. The combination of surface metal layer and metal underlayer are carefully chosen such that an intermetallic alloy layer can form when the two layers are interdiffused, and this intermetallic alloy layer has a melting point significantly higher than that of the surface metal layer in pure form.

When the wafers are brought together such that surface metal layers 500 are in contact, with sufficient pressure to assure that substantially all of the wafer surfaces are in contact, and then heated to or beyond the melting point of the surface metal layer, the surface metal layer melts and thus provides the benefit typical of solder bonding, which is conformability to surface roughness, texture, and particles, so long as the total thickness of the surface Metal layers is sufficient.

Figure 5:
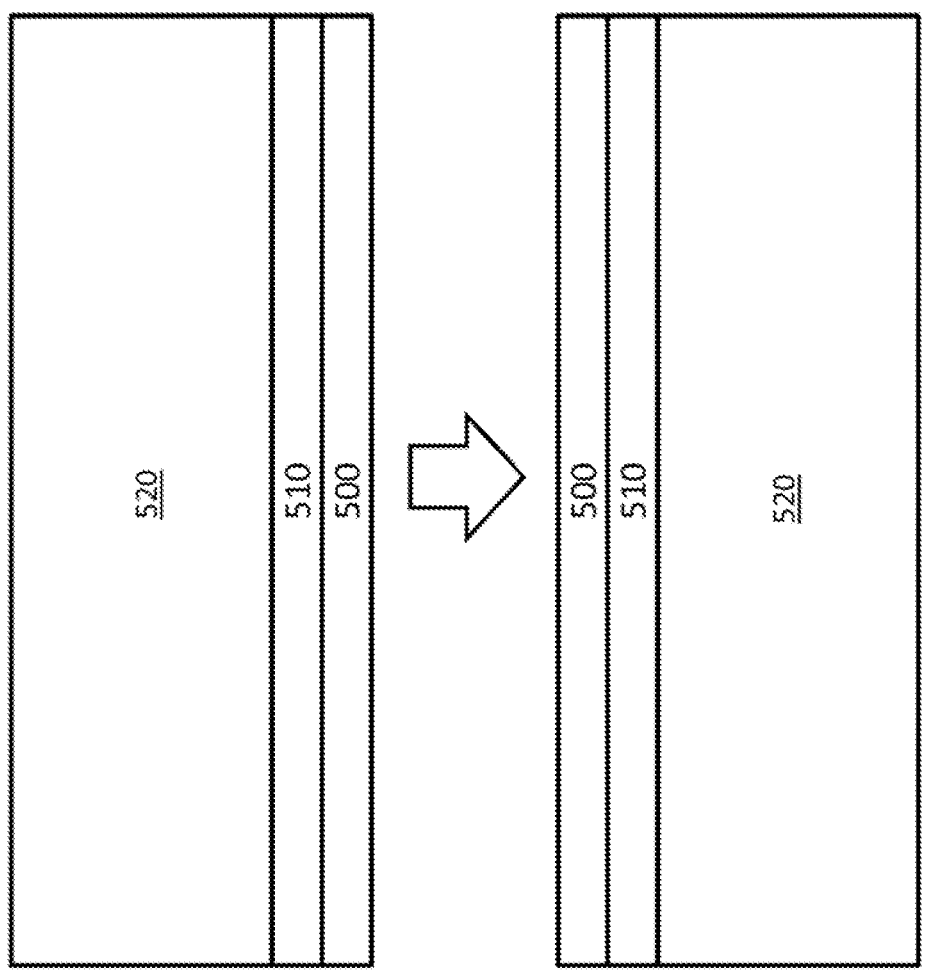
FIGS. 5(a-b) are profile diagrams of a bond in accordance with an exemplary transient liquid phase bonding embodiment of the invention.
Figure 5:
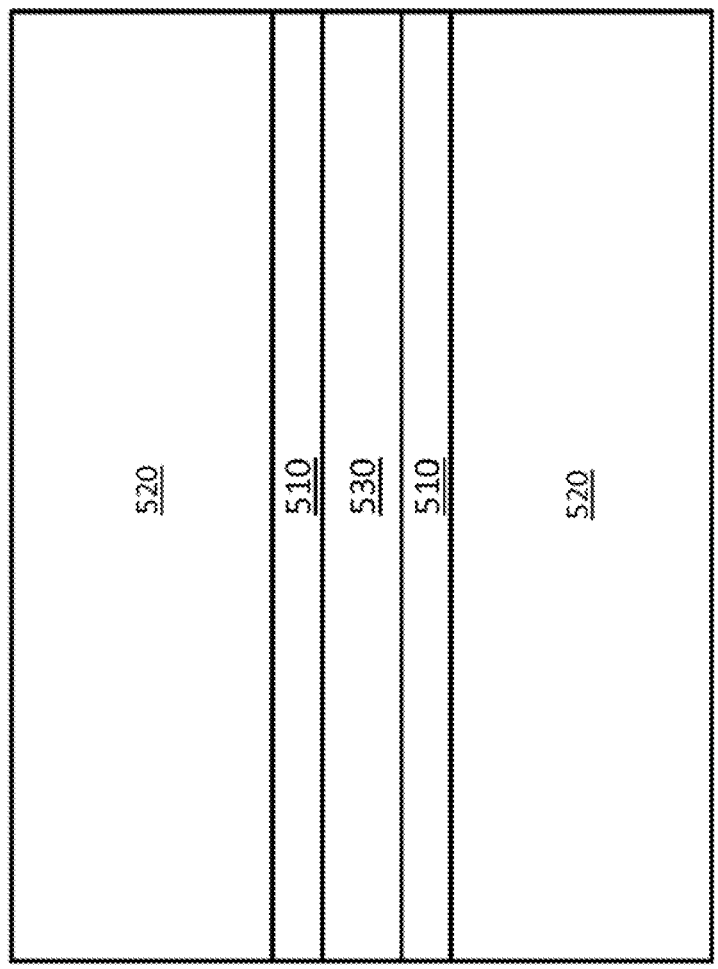

It is typical of liquid-solid metal interfaces that very heightened interdiffusion takes places between the solid and liquid region. Therefore, once the surface metal layers 500 are melted, they interdiffuse with metal underlayers 510, rapidly forming an intermetallic region. For example, if Sn and Ni are used for the surface metal layer and metal underlayer respectively, an intermetallic region of $Ni_3Sn_4$ may be formed. Because $Ni_3Sn_4$ has a melting point of near 800° C., it quickly solidifies even if the bonding temperature has not been lowered. Thus, the formation of a high melting point, solid intermetallic, from the interdiffusion of two or more metals, at least one being a lower melting point liquid, occurs isothermally. If the metal underlayers 510 are of sufficient thickness, then the entirety of the surface metal layers 500 are consumed in this process, and no more liquid metal remains. With reference to FIG. 5b, an intermetallic metal bonding layer 530 has been formed which has a re-melt temperature much higher than the surface metal layer melting point. Portions of metal underlayers 510 may remain after intermetallic layer 530 formation.

The stack of metals used to provide the TLP bond process is not limited to a particular symmetry on the carrier and/or donor substrate. In one embodiment, a stack of high, melting point metal sandwiched between low melting point metals may be deposited completely on, for example, the donor substrate or carrier substrate. The intended bonding surface of the respective donor or carrier may be bonded, as previously described, to the deposited stack of metals deposited on the respective donor or carrier substrate. The stack of metals is also not limited to interdiffusion of two metals and may use two or more metals to provide an interdiffusion region.

In another example, a layer of low melting point metal may be deposited on both the carrier and donor substrate. A layer of high melting point metal may be deposited on one of the carrier and donor substrate. The carrier and donor substrates with respective deposited metal may then be bonded as previously described. In another example, a layer of low melting point metal may be deposited on one of the carrier or donor substrate. A layer of high melting point metal may be deposited on the other respective carrier or donor substrate. The high melting point metal surface and low melting point metal surface may be mated together in the melting and bond process. The process may be designed around the pre-bonding processing temperatures of either the donor or carrier substrate. For example, a pre-bonding processing temperature of the donor substrate above the low melting point metal may make advantageous not to deposit the low melting point metal on the donor substrate and only on the carrier substrate.

Advantages may be achieved by an intermetallic region with a melting temperature just above the lower melting metal or a melting temperature above both the lower and higher melting metals. In some application it may be advantageous to ensure that all lower melting metals are consumed in the intermetallic region to ensure a bond temperature above the lower melting metal. Similarly, it may also be advantageous to ensure that both lower and higher melting metals are consumed in the intermetallic region to ensure a bond temperature above both lower and higher melting metals.

This embodiment can be identical or similar to the Exemplary Solder Embodiment previously described above, with the exception of three portions of the process: bonding layer deposition on donor, carrier substrate preparation, and bonding, as further explained.

Bonding Layer Deposition on Donor

Figure 6:
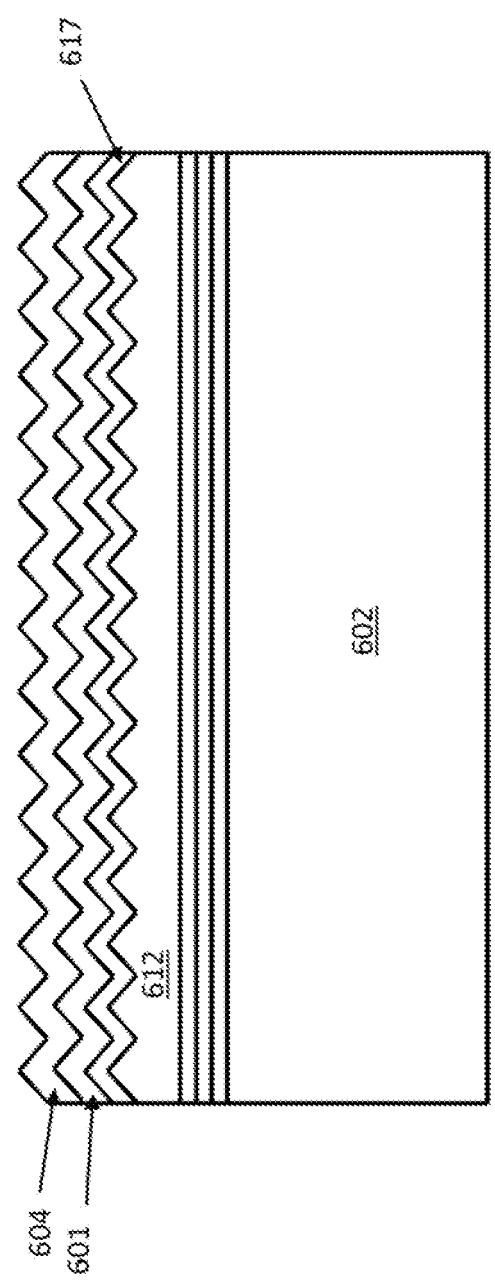
FIGS. 6(a-c) are profile diagrams of a bonded device in accordance with an exemplary transient liquid phase bonding embodiment of the invention.
Figure 6:
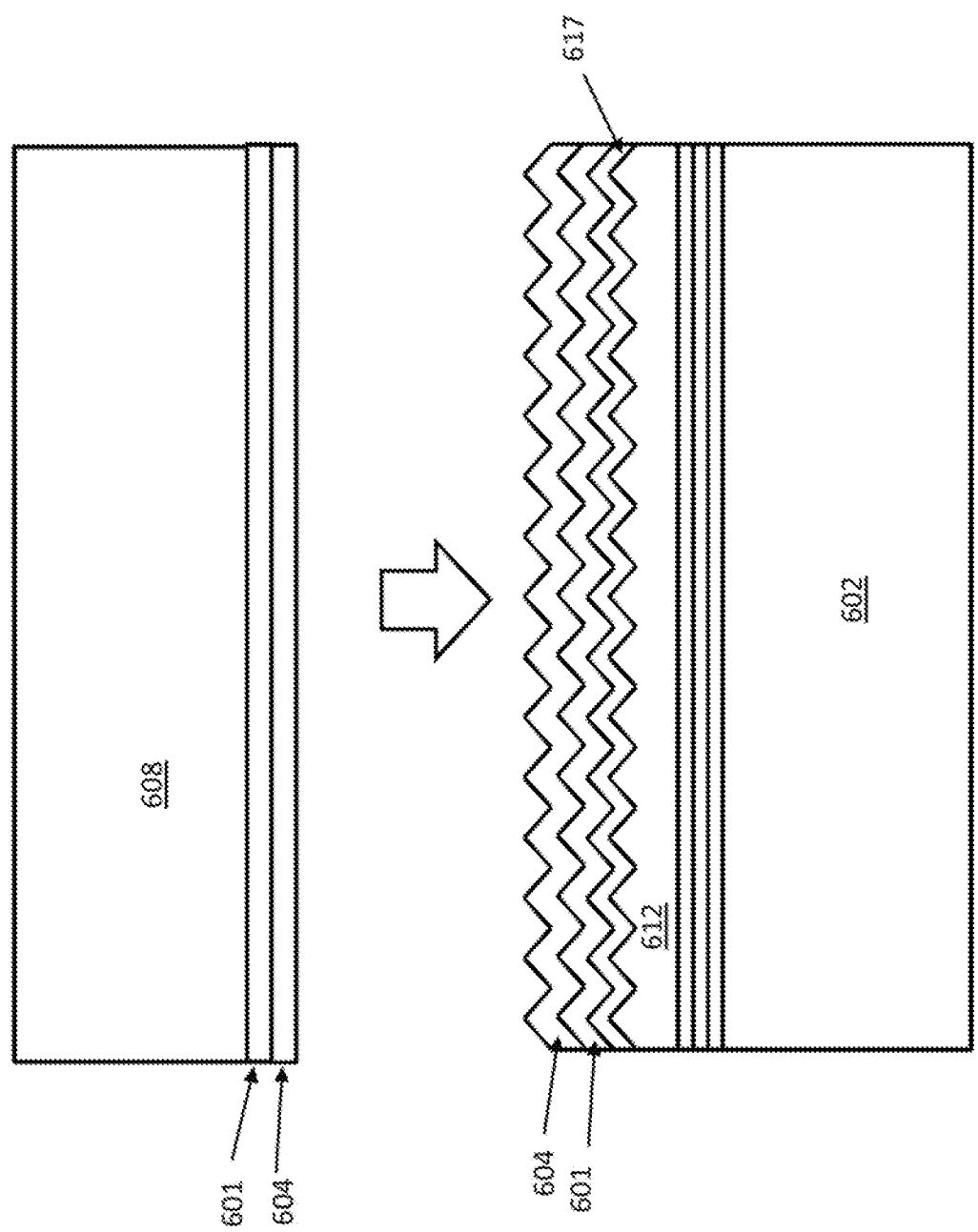
Figure 6:
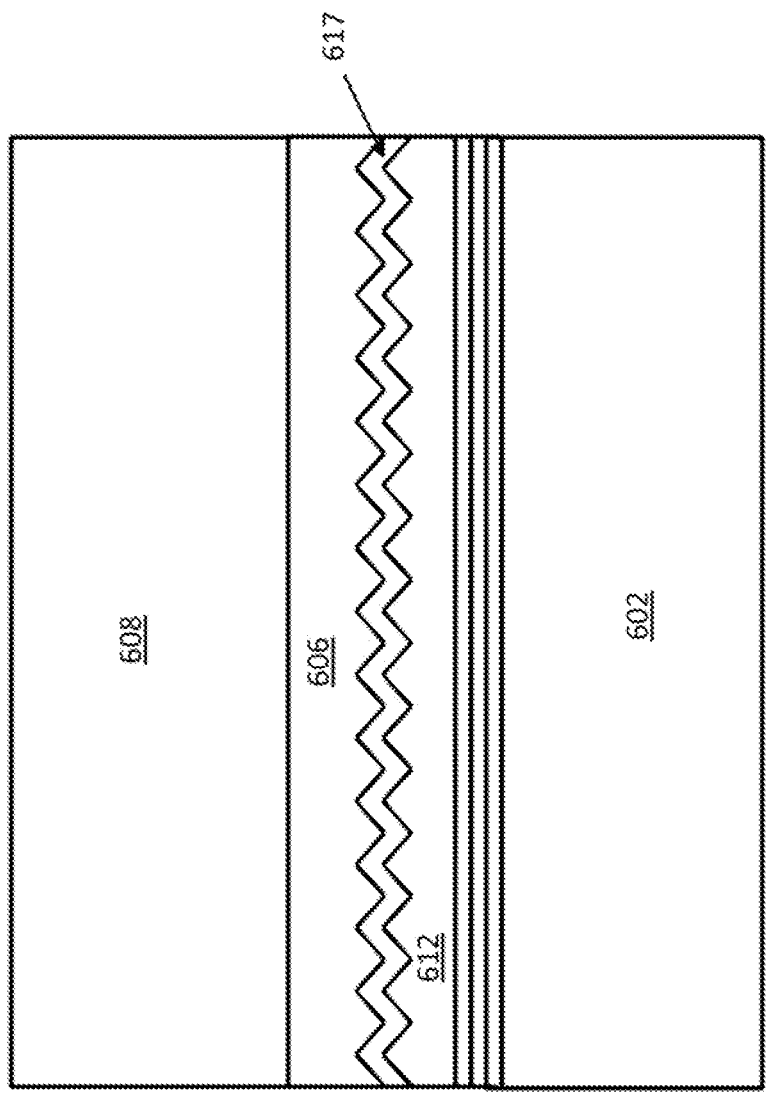

Referring to FIG. 6a, conductive metal bonding layers 601 and 604 may be deposited on the surface of the donor substrate 602 and solar cell portion. An n-type silicon layer 617 more heavily doped than base region 612 may be formed using standard processes; e.g., with a $POCl_3$ diffusion source. The thickness of this layer can be e.g. 0.1-1 microns, while the doping can be between 1017-1019 cm-3. All other layers in FIG. 6a are as described in greater detail previously with respect to the Exemplary Solder Embodiment. In one embodiment, metal layer 601 may be a Ni layer of thickness e.g. 0.2-5 microns, while metal layer 604 may be a Sn layer of thickness e.g. 0.2-5 microns. In another embodiment, metal layer 601 may be a Cu layer of thickness e.g. 0.2-5 microns, while metal layer 604 may be an In layer of thickness e.g. 0.2-5 microns. Metal layer 601 corresponds to the metal underlayer of the TLP bonding discussion above, while metal layer 604 corresponds to the surface metal layer of the TLP bonding discussion above. These layers may be deposited by means well known in the art such as, but not limited to, thermal evaporation, sputtering, electrodeposition, or screen printing. Note that a thin layer to promote adhesion (e.g. 10-50 nm thick) may be deposited between metal layer 601 and the donor substrate. For example, this layer could be Cr or Ti, deposited e.g. by such methods as, but not limited to, sputtering or evaporation. The deposition may be performed such that there is no exposure to an oxygen-containing ambient between the depositions of different metal layers, to prevent native oxide formation between the different metal layers. In addition to the adhesion layers, other layers may be used to reduce or prevent the diffusion of the adhesion layer and/or metal bonding layer into the various other device or solar cell layers.

Carrier Substrate Preparation

Referring to FIG. 6b, the donor substrate 602, including the first portion of a solar cell, may be bonded to a carrier substrate 608. All of the details of, and options for, carrier substrate 608 are as described in greater detail above in Exemplary Solder Embodiment. Referring to FIG. 6b, conductive metal bonding layers 601 and 604 may be deposited on the surface of the carrier substrate 608. In one embodiment, metal layer 601 can be a Ni layer of thickness e.g. 0.2-5 microns, while metal layer 604 can be a Sn layer of thickness e.g. 0.2-5 microns. In another embodiment, metal layer 601 may be a Cu layer of thickness e.g. 0.2-5 microns, while metal layer 604 may be an In layer of thickness e.g. 0.2-5 microns. Metal layer 601 corresponds to the metal underlayer of the TLP bonding discussion above, while metal layer 604 corresponds to the surface metal layer of the TLP bonding discussion above. These layers may be deposited by means well known in the art such as, but not limited to, thermal evaporation, sputtering, electrodeposition, or screen printing. Note that a thin layer to promote adhesion (e.g. 10-50 nm thick) may be deposited between metal layer 601 and the donor substrate. For example, this layer could be Cr or Ti, deposited e.g. by such methods as, but not limited to, sputtering or evaporation. The deposition may be performed such that there is no exposure to an oxygen-containing ambient between the depositions of different metal layers, to prevent native oxide formation between the different metal layers.

Bonding

The wafer bonding can be achieved in a tool such as an EVG (Electronic Visions Group) 510 bonder, or a SUSS SB6e bonder. In one embodiment, the donor wafer and carrier wafer are approximately the same size, and are brought substantially into alignment prior to contact, e.g. with not more than 1 mm lateral offset, within the bonding tool. Wafers may be brought into contact in a closed bonding chamber, in an ambient of e.g. nitrogen or air at a background pressure of e.g. 0.01-1 atm. After wafers are brought into contact a force of e.g. 0.1-1 MPa may be applied. While this force is maintained the contacted wafer pair may be brought to a peak temperature above the melting point of the low-melting-point metal. For example, this temperature may be 232-300° C. if the surface metal layer 604 is Sn, or just 157-200° C. if the surface metal layer 604 is In. This temperature may be maintained only briefly, e.g. 1-30 seconds. While the low-melting-point metal is in a liquid phase, it will conform to any non-planar topology at the bonded interface arising from (a) surface roughness of the donor or carrier wafer, (b) particles at the bonding interface, or (c) surface texturization, provided that such topology is thinner than the combined thickness of the low-melting-point metal layers on one or both of the donor and carrier wafer.

Referring to FIG. 6c, once the surface metal layer 604 liquefies, if the surface metal layer 604 and the metal underlayer 601 were properly chosen, metal interdiffusion will quickly lead to formation of a solid intermetallic layer 606, with a melting point well above the bonding temperature. This intermetallic layer now joins the two substrates. With proper selection of the relative thicknesses of layers 604 and 601, no liquid metal will remain after intermetallic formation. For the case of Ni Sn TLP bonding, full consumption of the surface metal layer such that no liquid metal remains after bonding will occur when the ratio of total number of Sn atoms to total number of Ni atoms is less than or equal to the ratio in the resulting Ni—Sn compound(s) (e.g. 4:3 for $Sn_4Ni_3$). In some embodiments, some of metal underlayer 601 will remain above and/or below newly-formed intermetallic layer 606 (not shown in FIG. 6c).

After this, cleaving and all exemplary subsequent steps are as described in greater detail above in the exemplary sold embodiment. Various embodiments can be identical or similar to the exemplary devices and methods of construction of the exemplary solder embodiment with the replacement or variations discussed in the TLP bonding embodiment as previously described above.

Exemplary Solder Embodiment

Figure 7:
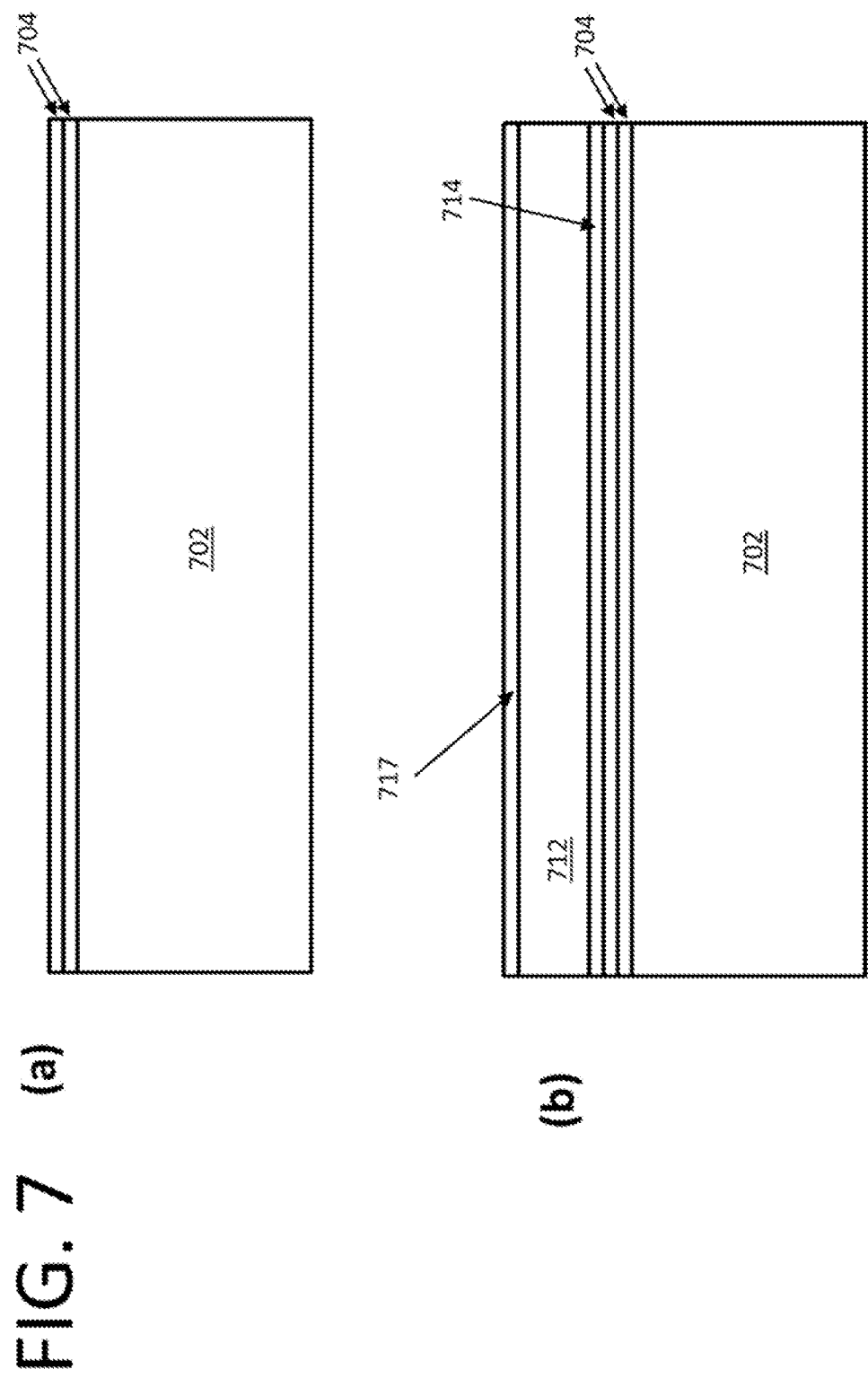
FIGS. 7(a-j) are profile diagrams of a device with silicon layer transfer constructed in accordance with an exemplary solder bonding embodiment of the invention.
Figure 7:
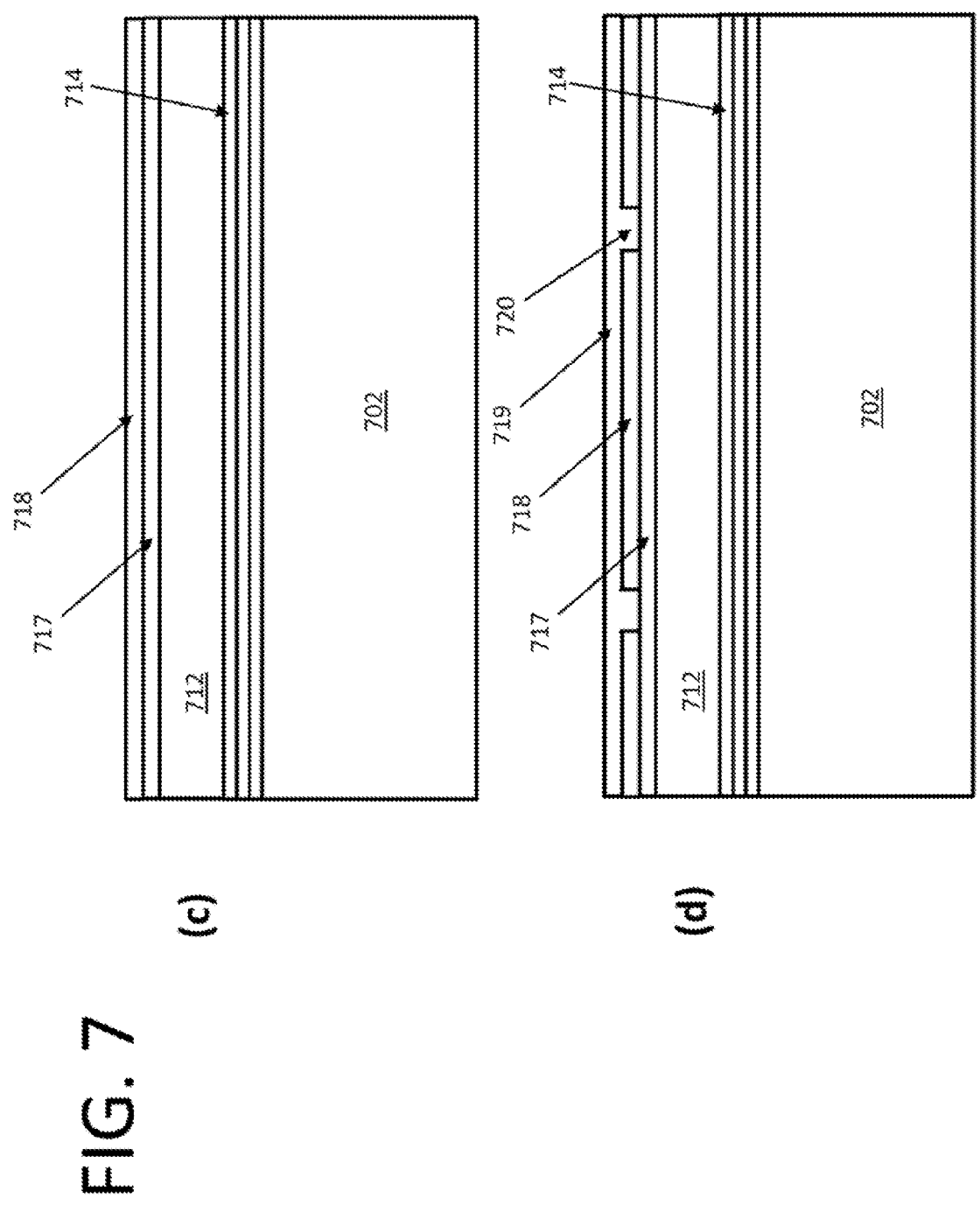
Figure 7:
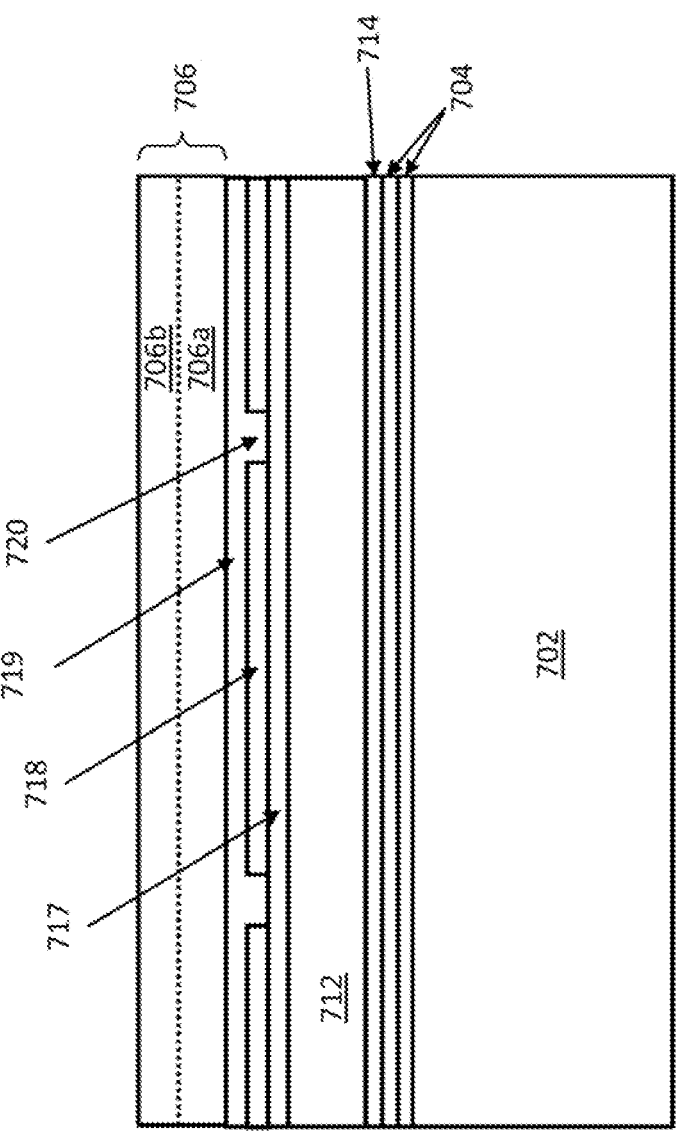
Figure 7:
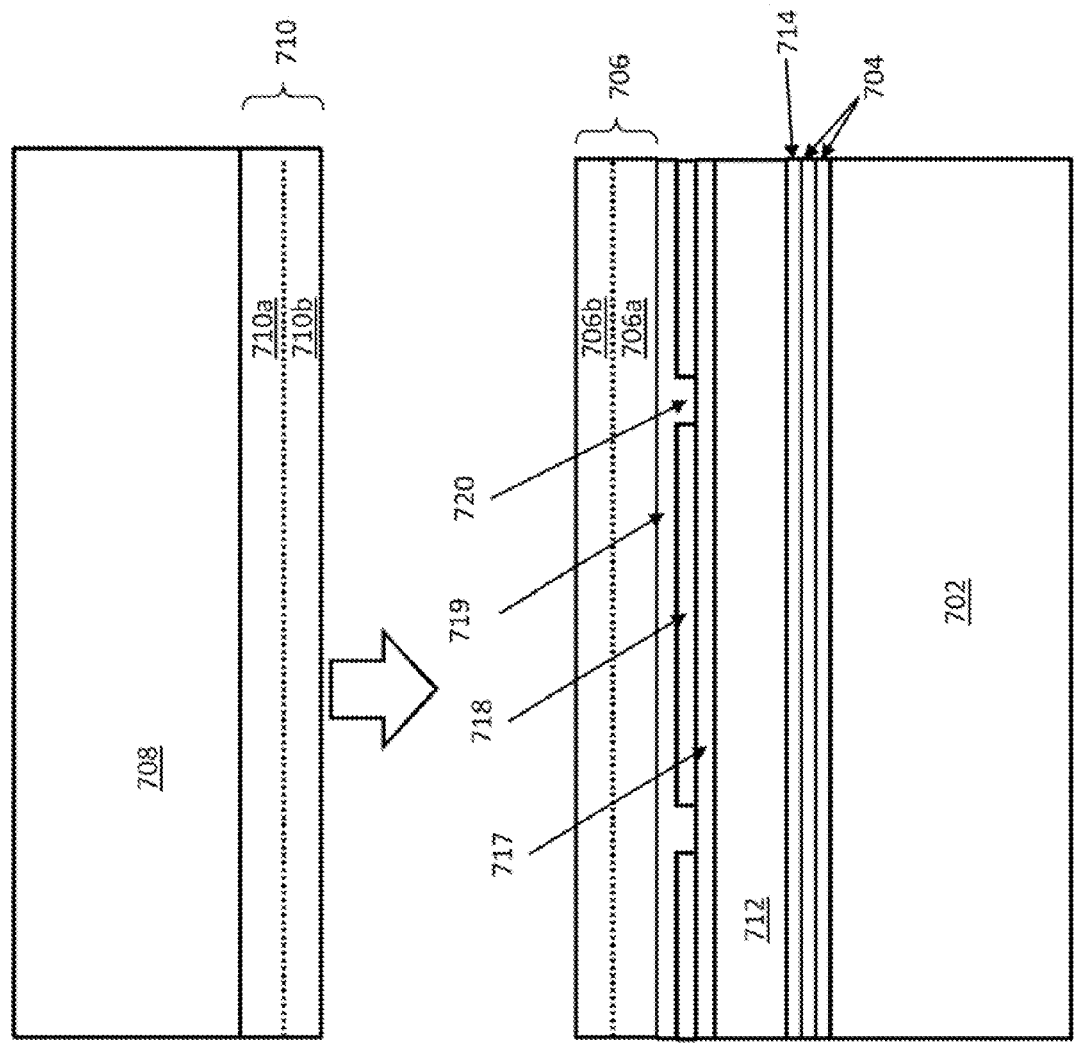
Figure 7:
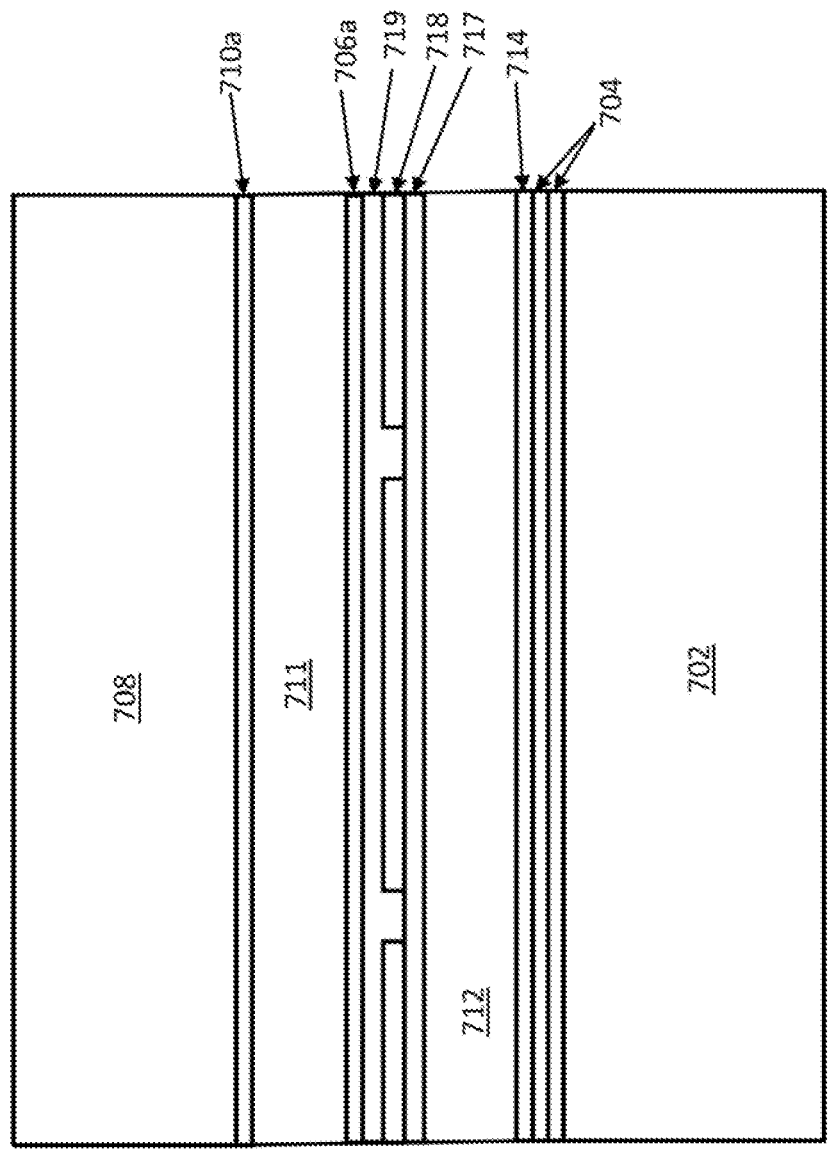
Figure 7:
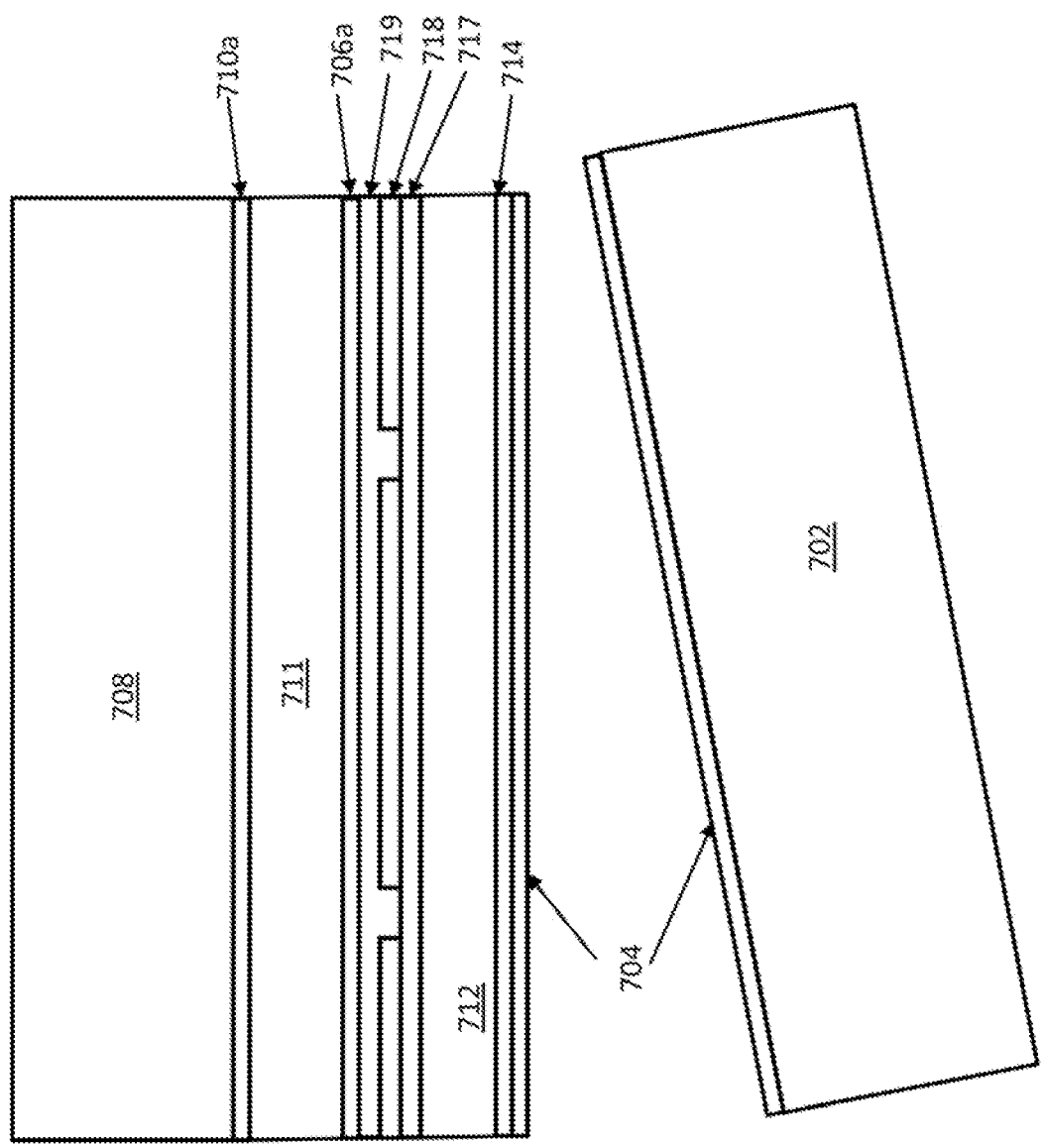

Referring to FIGS. 7(a-j), an exemplary solar cell device is constructed in accordance with an exemplary solder bond embodiment of the invention. It should be noted that although the various embodiments disclosed herein relate to a solar device, embodiments of the invention are not limited to solar devices and may be used in the construction of various microelectronic and optoelectronic devices. A monocrystalline silicon donor substrate 702 may be used to construct a first portion of a solar cell and the porous region used later for separation. The donor substrate 702 may be, for example, but not limited to, a (100) or (111) surface orientation. The donor substrate 702 may have a thickness of about 150-2000 microns, for example. The diameter of the donor substrate 702 may be, but is not limited to, standard wafer sizes of about 100-300 mm. Alternately, a square or semi-square substrate may be used, of approximately 5" or 6" on a side, such as is commonly used in crystalline Si solar cells. The donor substrate 702 may be doped p-type or n+ or alternately may be more lightly doped n-type if it is illuminated during porous silicon formation.

Porous Layer Formation

According to the exemplary embodiment, the donor substrate 702 may be p-type and have resistivity below about 1 ohm-cm. Referring to FIG. 1a, dual porous layers 704 may be formed on the surface of the donor substrate 702. The top porous layer may have a lower porosity, to serve as a template for subsequent epitaxial growth. The bottom porous layer may have a higher porosity, to allow subsequent splitting. An exemplary approach to creating a splitting plane is known in the art and is described in, for example, Yonehara & Sakaguchi, JSAP Int. July 2001, No. 4, pp. 10-16. The porous layers 704 may also be stabilized via brief thermal oxidation and may also be sealed via anneal under $H_2$ as described in Yonehara & Sakaguchi.

Details of an exemplary process for forming porous Si splitting layers are as follow. A p-type (100)-oriented monocrystalline Si substrate, with resistivity between 0.01-0.02 ohm-cm, may be immersed in a solution composed of one part hydrofluoric acid, one part water, and one part isopropyl alcohol. The substrate is in series and in-line with two electrodes, formed e.g. of silicon or diamond, one facing the front of the wafer and the other facing the back. The substrate holder is electrically insulating, forcing electrical current to pass primarily through the substrate and not around the wafer periphery. The electrodes may be separated from the substrate by a distance of at least 10% of the diameter of the substrate. Through application of a voltage to such an apparatus, an electrical current flows in the solution and through the substrate, resulting in a porous silicon layer being etched into a surface of the substrate. Two different voltages, one after another, may be applied between the electrodes, resulting in the formation of two different porous silicon layers 704 on a surface of the substrate. The first layer, which may be etched at a current density of 2-10 mA/cm$^2$ to a depth of 0.5-2 microns (etch time approximately 0.5-5 minutes), is low porosity (approximately 25%). The second layer, buried under the first layer and which may be etched at a current density of 40-200 mA/cm$^2$ to a depth of 0.25-2 microns (etch time approximately 2-30 seconds), is higher porosity. The second layer defines a cleave plane after subsequent cleaning, epitaxy, and bonding, described in further detail below. After etching, the wafers may be immersed in a mixture of sulfuric acid and hydrogen peroxide, self-heating to approximately 80-140° C., for 10 minutes for cleaning. Other standard semiconductor cleaning solutions, such as SC-1, SC-2, hydrofluoric acid, hydrochloric acid, or isopropyl alcohol, may also be used. Wafers may then be loaded into the silicon growth system.

Epitaxial Growth

Referring to FIG. 7b, an n-doped epitaxial silicon film 714 of thickness e.g 100-1000 nm with in-situ doping via e.g. phosphous to a level of greater than about $10^{17}$ cm$^{-3}$ may then be grown on top of the porous region using Atmospheric Pressure Chemical Vapor Deposition (APCVD) or Low Pressure Chemical Vapor Deposition (LPCVD), for example, with precursors such as dichloro-silane (DCS) or trichloro-silane (TCS), at temperatures above e.g. 900 C. Processes for silicon epitaxy with in-situ doping are very well known in the art. A typical precursor used for n-type in-situ doping is phosphine. This n-type region 714 may serve as the base contact region, or front surface field (FSF) of the solar cell. Methods of growing high quality epitaxial regions on porous silicon are well known in the art and may involve a step before epitaxial growth to seal the exposed surface pores, such as, for example, an anneal step under an $H_2$ ambient, as described e.g. in N. Sato at S. Ishii et al, "Reduction of Crystalline defects to 50/cm$^2$ in Epitaxial Layers of Porous Silicon for ELTRAN® Process", in the proceedings of the 1998 IEEE Silicon On Insulator conference. Following this, an n-doped epitaxial film 712 of thickness e.g. 3-30 microns, with in-situ doping via e.g. arsenic or phosphorous to a level of $1\times10^{15}$ cm$^{-3}$-$1\times10^{17}$ cm$^{-3}$ may then be grown; this will serve as the base (absorber) region of the solar cell. Following this, a p-doped emitter region 717 of thickness e.g. 100-1000 nm with in-situ doping via e.g. boron to a level of greater than about $10^{17}$ cm$^{-3}$ may then be grown.

Rear Surface Passivation

Referring to FIG. 7c, a passivation layer 718 is disposed upon the surface of p-type silicon layer 717. Passivation layer 718 may be any of the standard films used to passivate silicon solar cells, such as amorphous silicon (a-Si), silicon nitride (SiN$_x$), silicon dioxide (SiO$_2$), or aluminum oxide (Al$_2$O$_3$). Passivation layer 718 may be deposited via common methods, well known in the art, such as plasma-enhanced chemical vapor deposition (PECVD), atomic layer deposition (ALD), or, in the case of SiO$_2$, thermal oxidation of p-type silicon layer 717. The thickness of the passivation layer can be in the range of e.g. 1-100 nm.

Rear Surface Contacting

Referring to FIG. 7d, a contact layer 719 may be disposed on passivation layer 718. Contact layer may comprise e.g. Aluminum (Al) and may be deposited via standard methods such as evaporation, sputtering, screen printing (of aluminum-containing paste), or plating. In cases where passivation layer 718 is electrically insulating, the contact layer 719 may need to penetrate a portion of passivation layer 718 to achieve electrical contact to the solar cell. This may be achieved by various methods, including: (a) patterning passivation layer 718 (e.g. through photolithography, or through laser ablation as described in Jens Müller et al, Journal Of Applied Physics 108, 124513, or through screen printing of a sacrificial paste containing a cutting agent which can etch through the passivation layer 718, as is known in the art) prior to contact layer deposition to provide openings 720 for contact layer 719 to contact p-type silicon layer 717; or (b) firing of contact layer 719 through passivation layer 718 through methods such as laser annealing as described in, for example, E. Schneiderlöchner, R. Preu, R. Lüdemann, and S. W. Glunz, "Laser-Fired Rear Contacts for Crystalline Silicon Solar Cells," Progress in Photovoltaics: Research and Applications 20 (2002) 29. Note that the combination of a dielectric layer backed by a metal layer such as aluminum can form a very effective reflector layer for the rear of the completed solar cell; for example, see "Hybrid. Dielectric-Metallic Back Reflector for Amorphous Silicon Solar Cells" by Mutitu et al. in *Energies* 2010, 3, 1914-1933. In the case of (a) above, after contact layer 719 deposition, an anneal may be performed to cause Al doping of the Si through the openings 720 (such as described in "Characterisation Of Local Al-BSF Formation For Perc Solar Cell Structures" by Grasso et al, proceedings of the 25th European PV Solar Energy Conference, Valencia, Spain, 2010) thus forming p+ regions in the silicon (not illustrated) aligned with the contact openings 720. These p+ regions may be doped up to e.g. $10^{19}$ cm$^{-2}$ or higher, and may extend into silicon up to e.g. 1-10 microns. This will lead to reduced contact resistance.

Bonding Layer Deposition on Donor

Referring to FIG. 7e, conductive metal bonding layers 706 may be deposited on the surface of the donor substrate and solar cell portion. In one embodiment, bonding layers 706 may be comprised of a high melting point metal layer 706a e.g. 0.5-5.0 microns thick, followed by a low-melting-point metal layer 706b e.g. 0.5-5.0 microns thick. For example, the high melting point layer 706a could be Ni or Ti, and the low melting point layer 706b Sn. Alternately, the high melting point layer 706a can be Cu, and the low melting point layer 706b can be In. High melting point layer 706a may be of thickness sufficient so that all of low melting point layer 706b is consumed in the formation of intermetallic compound layer 711 as described subsequently. For example, layer 706a may be 50% thicker than layer 706b. Additionally, deposition of high melting point layer 706a may be preceded by deposition of a thin layer to promote adhesion such as Cr or Ti (e.g. 10-50 nm thick). All of these layers may be deposited by processes well known in the art such as, but not limited to, thermal evaporation, sputtering, electrodeposition, or screen printing. The deposition may be performed such that there is no exposure to an oxygen-containing ambient between the depositions of different metal layers, to prevent native oxide formation between the different metal layers.

Carrier Substrate Preparation

Referring to FIG. 7f, a carrier substrate 708 may be prepared for bonding to the donor substrate 702, including the first portion of a solar cell. The carrier substrate 708 may be, for example, inexpensive metallurgical grade silicon, or a metal such as steel or a low-CTE iron-nickel alloy such as Kovar™ or Invar'™, or a conductive ceramic such as polycrystalline aluminum titanium nitride, or a glass substrate such as standard float glass or borosilicate glass of thickness e.g. 0.1-2.0 mm thick, or other suitable material. The carrier substrate 708 may be of the same or a similar size as the donor substrate 702, or it may be larger such as to support multiple solar cells. The carrier substrate 708 may be rigid with a thickness in the range of e.g. 100-500 microns. Alternatively, the carrier substrate 708 may be flexible; for example, it may be a steel foil of thickness e.g. below 100 microns. The carrier substrate 708 may be electrically conductive. Alternately, the carrier substrate 708 can be insulating, but may be coated with metal layers on some or all of its surfaces to allow it to function as a conductive back contact to the thin Si solar cell. For example, the carrier substrate 708 can be standard float glass coated (encapsulated) completely in a 1-10 micron thick metal layer, such as Ni or Al; such a coating may be applied by evaporation, sputtering, or electrodeposition, for example.

The CTE of the carrier substrate may be approximately matched to that of donor substrate, to allow for subsequent thermal processing steps necessary to form the solar cell, without giving rise to excessive stress in the donor solar cell regions due to a mismatch between the CTE of the donor substrate and that of the carrier substrate. For example, the CTE of the carrier substrate may be less than about 6-10 ppm/° K. at room temperature. The carrier substrate 708 may have a peak-to-valley surface roughness of e.g. less than 2 microns, and a low local micro-roughness (preferably <1.0 micron root-mean-square roughness). Conductive metal bonding layers 710 may be deposited on the surface of the carrier substrate 708. In one embodiment, bonding layers 710 may be comprised of a high melting point metal layer 710a e.g. 0.5-5.0 microns thick, followed by a low-melting-point metal layer 710b e.g. 0.5-5.0 microns thick. For example, the high melting point layer 710a could be Ni or Ti, and the low melting point layer 710b Sn. Alternately, the high melting point layer 710a could be Cu, and the low melting point layer 710b In. High melting point layer 710a may be of thickness sufficient so that all of low melting point layer 710b is consumed in the formation of intermetallic compound layer 711 as described subsequently. For example layer 710a may be 50% thicker than layer 710b. Additionally, deposition of high melting point layer 710a may be preceded by deposition of a thin layer to promote adhesion such as Cr or Ti (e.g. 10-50 nm thick). All of these layers may be deposited by processes well known in the art such as, but not limited to, thermal evaporation, sputtering, electrodeposition, or screen printing. The deposition may be performed such that there is no exposure to an oxygen-containing ambient between the depositions of different metal layers, to prevent native oxide formation between the different metal layers. Note that the metal bonding layers 710b and 706b may be of the same material, for example both Sn; and the metal bonding, layers 710a and 706a may be of the same material, for example both Ti or both Ni.

The CTE of the carrier substrate 708 and/or donor substrate 702 may be coordinated to that of other layers in the device to allow for subsequent thermal processing steps necessary to form the solar cell, without giving rise to excessive stress in the donor solar cell regions due to a mismatch between the CTE of the donor substrate 702 and that of the carrier substrate 708. For example, the carrier substrate 708 may be steel with a CTE of about 11 e-6 ppm/° C. The donor substrate 702 may be silicon with a CTE of about 2.5 e-6 ppm/° C. The conductive metal bonding layers 710 may be selected to compensate for the difference and thus reduce the tension and/or provide compression of the donor substrate 702. For example, the conductive layer 710 can comprises Al with a CTE of about 24 e-6 ppm/° C. at a thickness of ½ to 1 times the thickness of the silicon donor substrate layers. Embodiments may compensate for thermal stress by selecting the materials used for one or more layers based on CTE of the material and/or respective thicknesses within the stack of layers used to construct the device.

Bonding

The wafer bonding can be achieved in a tool such as an EVG (Electronic Visions Group) 510 bonder, or a SUSS SB6e bonder, or a heated mechanical press. In one embodiment, the donor wafer and carrier wafer are approximately the same size, and are brought substantially into alignment prior to contact, e.g. with not more than 1 mm lateral offset, within the bonding tool. Wafers may be brought into contact in a closed bonding chamber, in an ambient of e.g. nitrogen or air at a background pressure of e.g. 0.01-1 atm. After wafers are brought into contact a force of e.g. 0.1-1 MPa may be applied. While this force is maintained the contacted wafer pair may be brought to a peak temperature above the melting point of the low-melting-point metal. For example, this temperature may be 232-300° C. if the low-melting-point metal is Sn. This temperature may be maintained only briefly, e.g. 1-60 seconds. Alternately, the temperature may be maintained for e.g. 1-60 minutes. While the low-melting-point layers are in a liquid phase, they may conform to any non-planar topology at the bonded interface arising from (a) surface roughness of the donor or carrier wafer, (b) particles at the bonding interface, or (c) surface texturization, provided that such topology is thinner than the combined thickness of the low-melting-point metal layers on one or both of the donor and carrier wafer. Once the low melting point layers melt, diffusion between the low- and high-melting point metal layers will typically be enhanced. Referring to FIG. 1g, this may lead to the formation of an intermetallic compound layer 711, comprised of the combined constituents the high- and low-melting point layers 706a, 706b, 710a, and 710b: e.g. $Ni_ySn_z$ (e.g. $Ni_3Sn_4$) or $Ti_wSn_x$ (e.g. $Ti_6Sn_5$) or $Cu_uIn_v$ (e.g. $Cu_2In$). The intermetallic layer may have a melting point substantially higher than the melting point of the low-melting-point metal layers, and so the intermetallic layer may solidify isothermally even while the metal layer stack is still exposed to the bonding temperature. This approach to metallic bonding, where a resulting intermetallic metal compound bonding layer has a melting point higher than some of the constituent layers, has been referred to as transient liquid phase bonding, as described in "Transient Liquid Phase Bonding" by W. D. MacDonald and T. W. Eagar, *Anna. Rev. Maier. Set* 1992.22: 23-46. This process may consume substantially all of the low melting point layers 706b and 710b, so the bonded metal joint will remain solid for temperatures well above the melting point of the low melting point metal. Some of high melting point layers 710a and/or 706a may remain unconsumed in the formation of intermetallic compound layer 711.

Cleaving

Referring to FIG. 7h, the donor substrate 702 may be removed from the first portion of a solar cell bonded to the carrier substrate 708 by cleaving the donor substrate within the porous layers 704. Separation may be via mechanical force alone, or enhanced with various other methods. For example, for the case of a flexible carrier substrate, mechanical flexing of the substrate may force a split to occur within the porous silicon regions, leading to separation of donor substrate 702 from the first portion of a solar cell bonded to the carrier substrate 708. In another example, a wedged device (not shown) may be applied to induce separation at the exposed external edges of the porous region 704. In another example, separation may be enhanced via application of a high pressure water jet directed at the edge of the porous silicon layers 704, as described in Yonehara & Sakaguchi. In yet another example, a wet acid solution, such as HF/H2O2, may also be exposed to the porous region 704 to erode the porous region 704 from the edge and enhance separation. In yet another example, for the case of a carrier substrate 708 with a CTE different than that of the silicon donor substrate 702, a thermal anneal may be used to induce stress in the bonded wafer pair, leading to separation within the porous Si layers 704 to relieve the stress. It should be understood that the above examples of separation may be used individually or in various combinations. Also, it should be noted that, for the case of a carrier substrate 708 with a CTE substantially different than that of the silicon donor substrate 702, it may be that cool down from bonding temperatures will induce sufficient stress in the bonded wafer pair to cause automatic separation within the porous Si layers 704 to relieve the stress.

Topside Processing

Referring to FIG. 7i, once the carrier substrate 708 and solar cell portion have been removed from the donor substrate 702, various post-separation processing of the solar cell portion and/or additional construction of a second portion of the solar cell may occur on the solar cell portion coupled to the carrier substrate 708. This and subsequent diagrams are flipped vertically from previous. Optionally, the porous layer 704 of the portion of the solar cell may be removed with wet acid etch as described in Yonehara & Sakaguchi, or in Nobuhiko Sato et al, Journal of the Electrochemical Society, v. 142 n.9 p. 3116-22, or via an etch in a KOH (Potassium hydroxide) solution, or via polishing. For example, porous layer 704 may be removed in a KOH solution of concentration 45% via immersion for e.g 30-90 minutes at room temperature. Alternately, it may be advantageous to leave some or the entire porous layer 704 intact, as the porous surface's roughness may enhance light capture by the solar cell. The top surface solar cell processing may also include steps not shown such as: surface roughening or texturization, surface passivation, and deposition of anti-reflection coatings, all well-known in the art of solar cell manufacturing. Also after splitting, the donor substrates 702 may be processed for reuse in the next wafer production cycle. This processing may include polishing, wet etching, or otherwise cleaning of the cleaved surface for subsequent formation of porous layers in future wafer production cycles. For example, this processing may include the removal of porous layer 704, via immersion in a KOH solution of concentration 45% for e.g 30-90 minutes at room temperature.

Referring to FIG. 7j, metal contact lines 716 may be constructed on the surface of the solar cell, for example, via screen printing. After application of metal contact materials 716, the structure may be annealed at a temperature of e.g. 100-300° C. This anneal may be performed in an ambient of e.g. forming gas. Before or after application of metal contact materials 716, selective contact area doping may be performed—that is, the n-type doping in areas directly beneath contact materials 716 can be increased, to allow lower contact resistance. Methods to do this are well known in the art.

Completed Solar Cell

Referring to FIG. 8a, the cell on the carrier substrate 708 may have the exemplary basic cell structure. N-type epitaxially grown silicon 712 may provide the solar cell base region. N+ epitaxially grown region 714 may provide the solar cell base contact region. Contact layer 719 (or in the absence of such contact layer, high melting point layer 706a) may provide bottom electrical contact to the p+ emitter region 717. Contact layer 719 (or in the absence of such contact layer, high melting point layer 706a) may provide light reflection for more complete light absorption in the base region.

This thin silicon cell approach may allow the high electrical conversion efficiency typical of bulk monocrystalline silicon solar cells (where whole silicon wafers of e.g. 150 micron thickness or more are used to form the solar cell) but with significant cost savings because of the dramatically reduced usage of the relatively expensive high-quality monocrystalline silicon. This advantage may be realized through the re-use multiple times of the relatively expensive monocrystalline silicon donor wafer 702. Another advantage of this structure may be a high open circuit voltage, due to the low recombination volume of the thin base region, leading to higher cell efficiency.

In an alternative embodiment, the configuration of the base and emitter can be reversed, so that in the deployed cell the n+ base contact region is buried and facing away from the sun, and the p+ emitter is facing the sun. In another alternative embodiment, the doping types can be reversed, so that the base region is p-type, the emitter region is n+, and the base contact region is p+. For this case, the cell may be configured such that the emitter is on the upper surface of the solar cell (facing the sunlight) and the base contact region is below the base and in proximity to the conductive bonding layers. Alternatively, the cell may be configured such that the base contact region is on the upper surface of the solar cell (facing the sun) and the emitter region is below the base and in proximity to the conductive bonding layers.

Figure 8B:
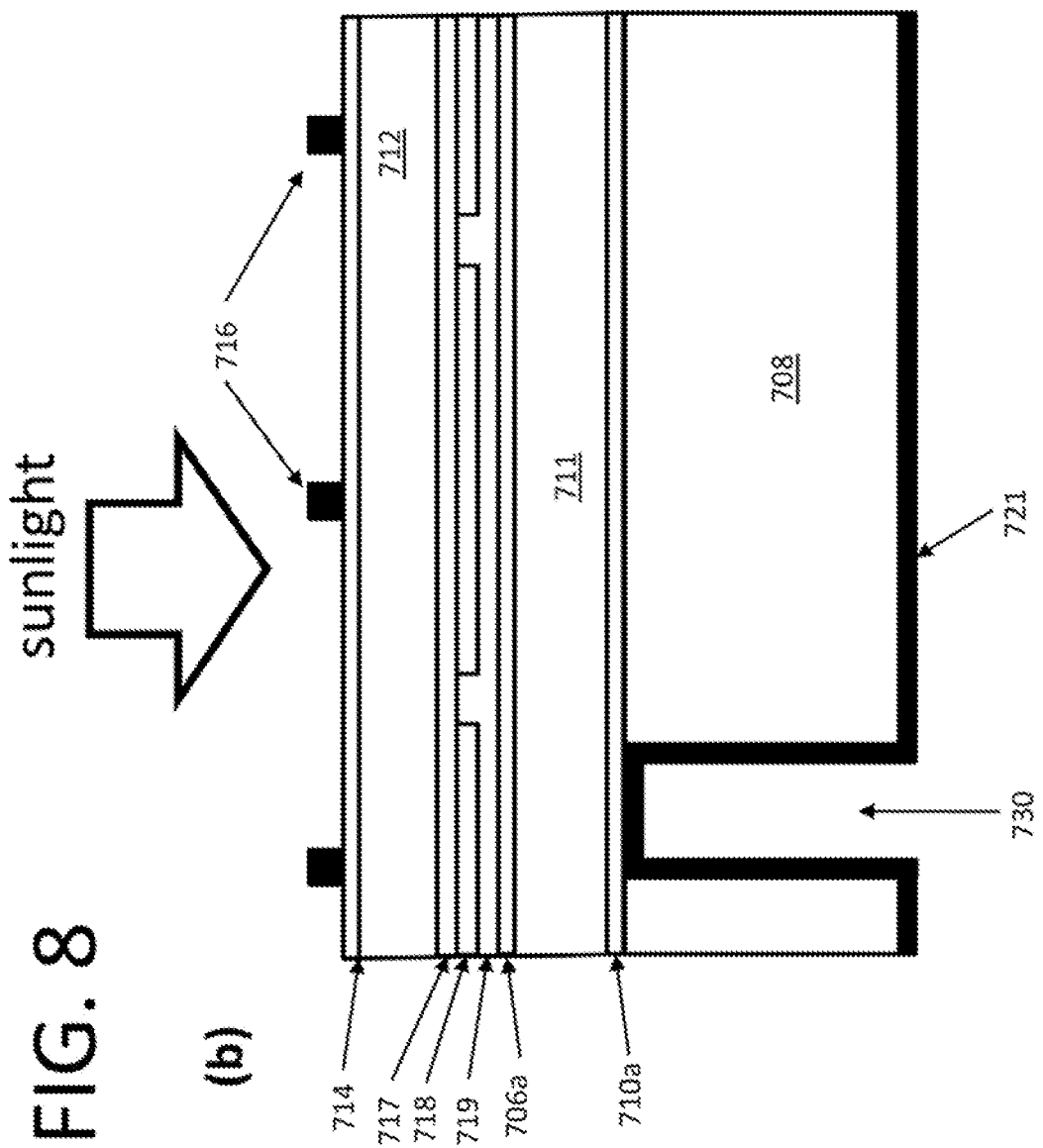
FIGS. 8(a-b) is a profile diagram of a completed device in accordance with the exemplary solder bonding embodiment of the invention.

After topside wiring for cell interconnect, the cells and/or carrier substrate may be covered with a protective polymer film such as EVA—not shown. Referring to FIG. 8b, for the case of an insulating carrier substrate 708, a hole or holes 730 may be drilled through the rear surface of the substrate (the sides away from the sunlight in the final configuration), stopping at or within the metal bonding layer region. Such hole or holes can be drilled using for example laser ablation. Such a hole or holes can allow a pathway for electrical contact to the rear of the solar cell. Still referring to FIG. 8b, a metal coating 721 on the back of the carrier substrate 708 may then also be used to allow electrical connection through the carrier substrate 708 to the bonding metals 710a or 711, which themselves provide electrical pathway to cell p+ emitter region 717. This coating may be deposited using, for example, but not limited to, screen printing, evaporation, sputtering, or electro-/electroless-plating. It should be noted that the solar cell structure is for illustrative purposes and the invention is not limited to the disclosed structure. Various devices may be constructed and materials can be deposited by a variety of techniques, including thermal or e-beam evaporation, DC or RF sputtering, electroplating, molecular beam epitaxy (MBE), atomic layer deposition (ALD), pulsed-laser deposition (PLD), spin coating, MOCVD, HVPE, liquid phase epitaxy (LPE), screen printing, or any other suitable technique. Materials can be annealed or undergo chemical reactions following deposition, or after additional materials or reactants are deposited or placed in proximity.

Figure 9:
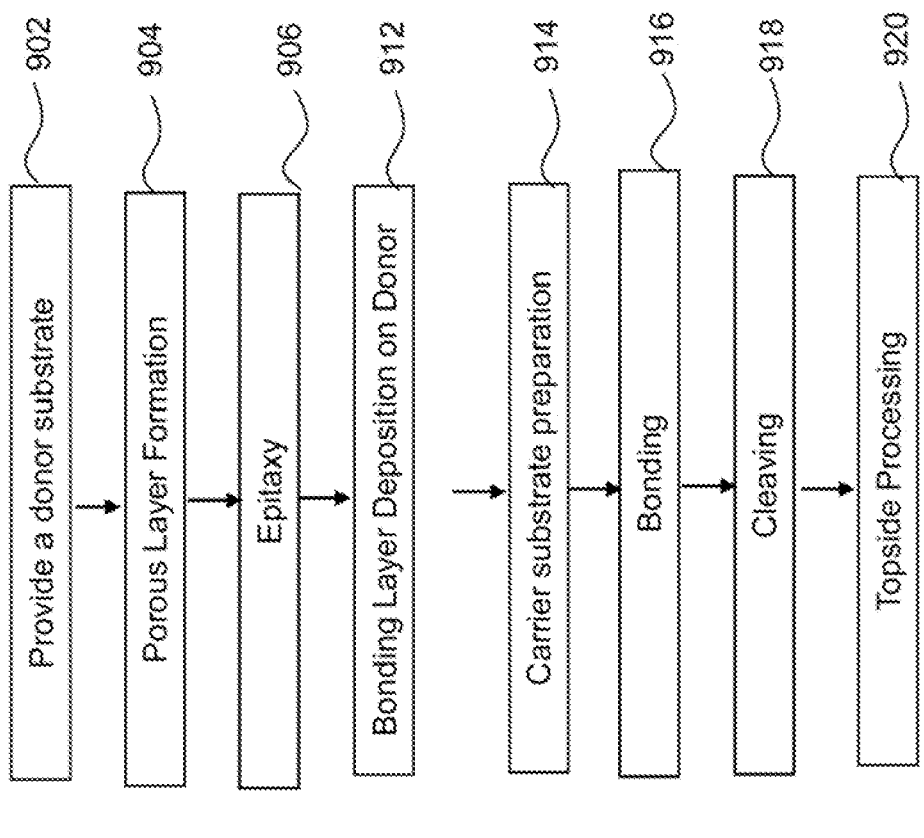
FIG. 9 is a flow chart of exemplary actions used to construct a device in accordance with the exemplary solder bonding embodiment of the invention.

Referring to FIG. 9, construction of the exemplary solder bond device 900 may include the following actions. The donor substrate as previously described is provided (block 902). One or more porous layers are formed on the donor substrate (block 904). A solar cell or device is constructed or partially constructed on top of the porous layer of the donor substrate by, for example, epitaxial growth (block 906) or other steps previously described. A solder bonding layer is deposited on the donor substrate (block 912). The carrier substrate is prepared by, for example, also depositing a solder bonding layer (block 914). The solar cell or device and donor substrate are solder bonded to the carrier substrate (block 916). The solar cell or device and carrier substrate are removed from the donor substrate by cleaving processes as previously described (block 918). The solar cell or device is processed further to completion (block 920) and the separated donor substrates may be processed for recycling. The exemplary method of construction may be modified to incorporate other embodiments, for example, but not limited to actions associated with rear surface passivation and contacting as described in previous embodiment.

Exemplary Solder Embodiment for III-V Solar Cell

Figure 10:
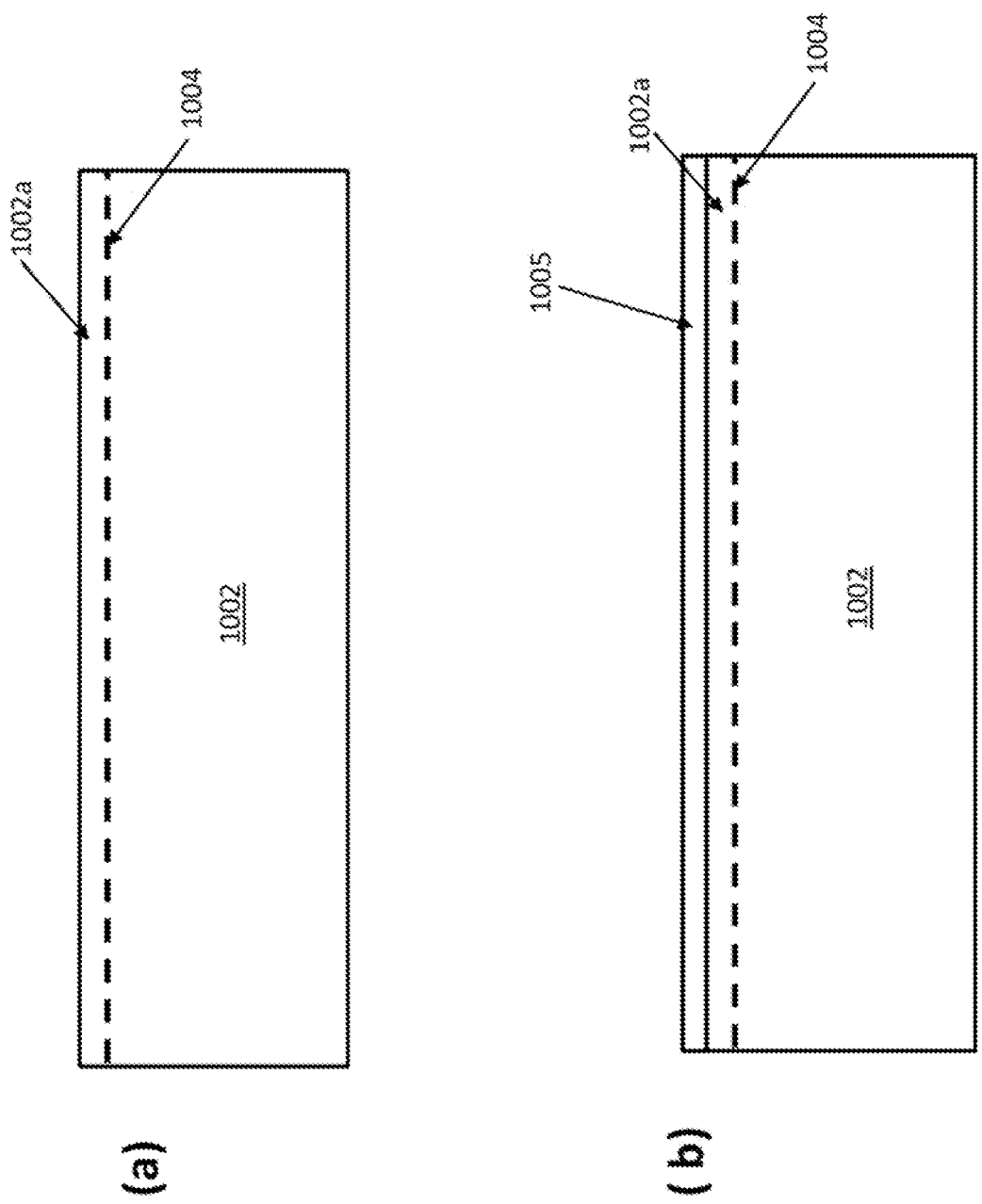
FIGS. 10(a-f) are profile diagrams of a device with germanium or III-V layer transfer constructed in accordance with an exemplary solder bonding embodiment of the invention.
Figure 10:
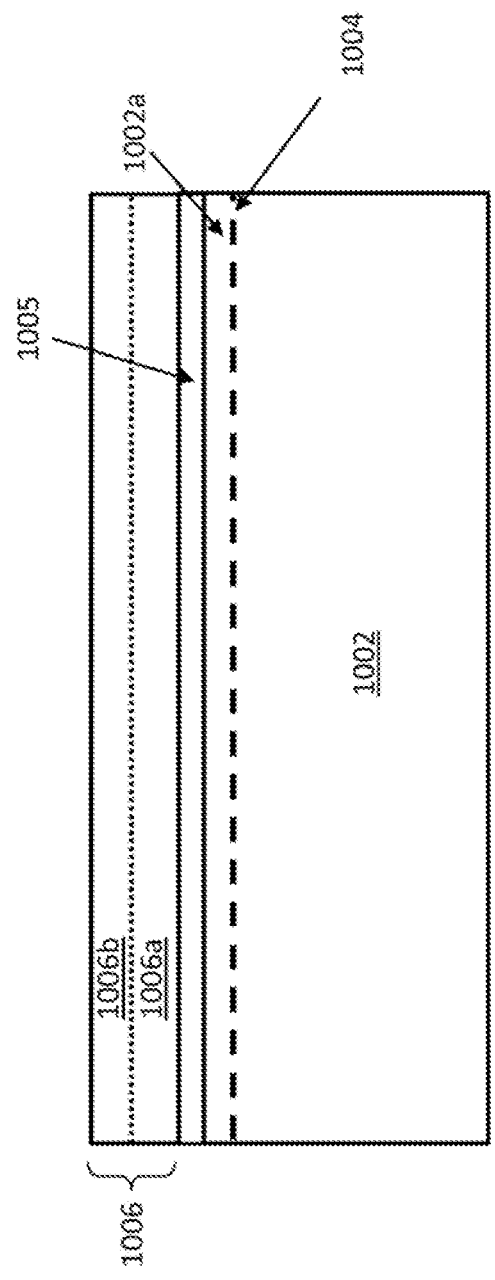
Figure 10:
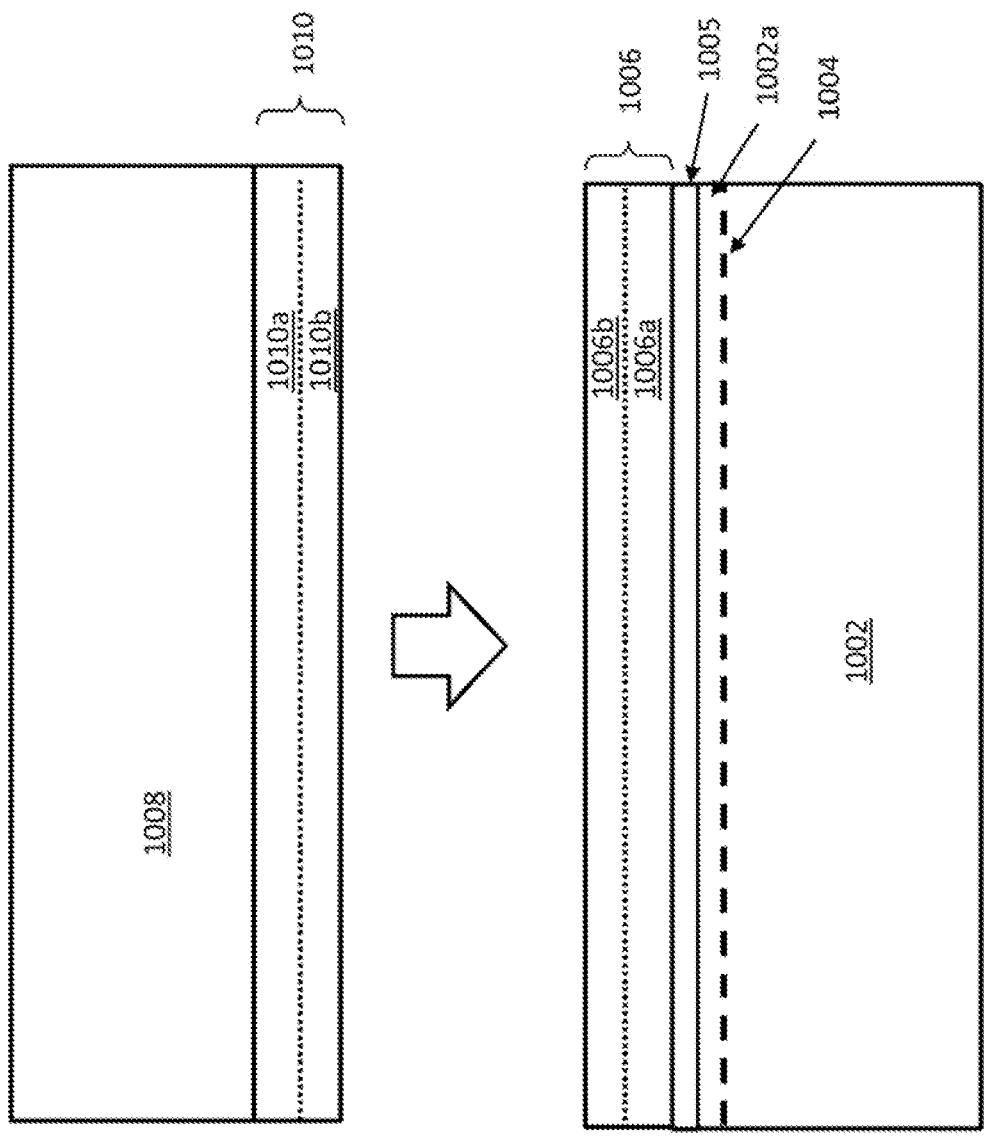
Figure 10:
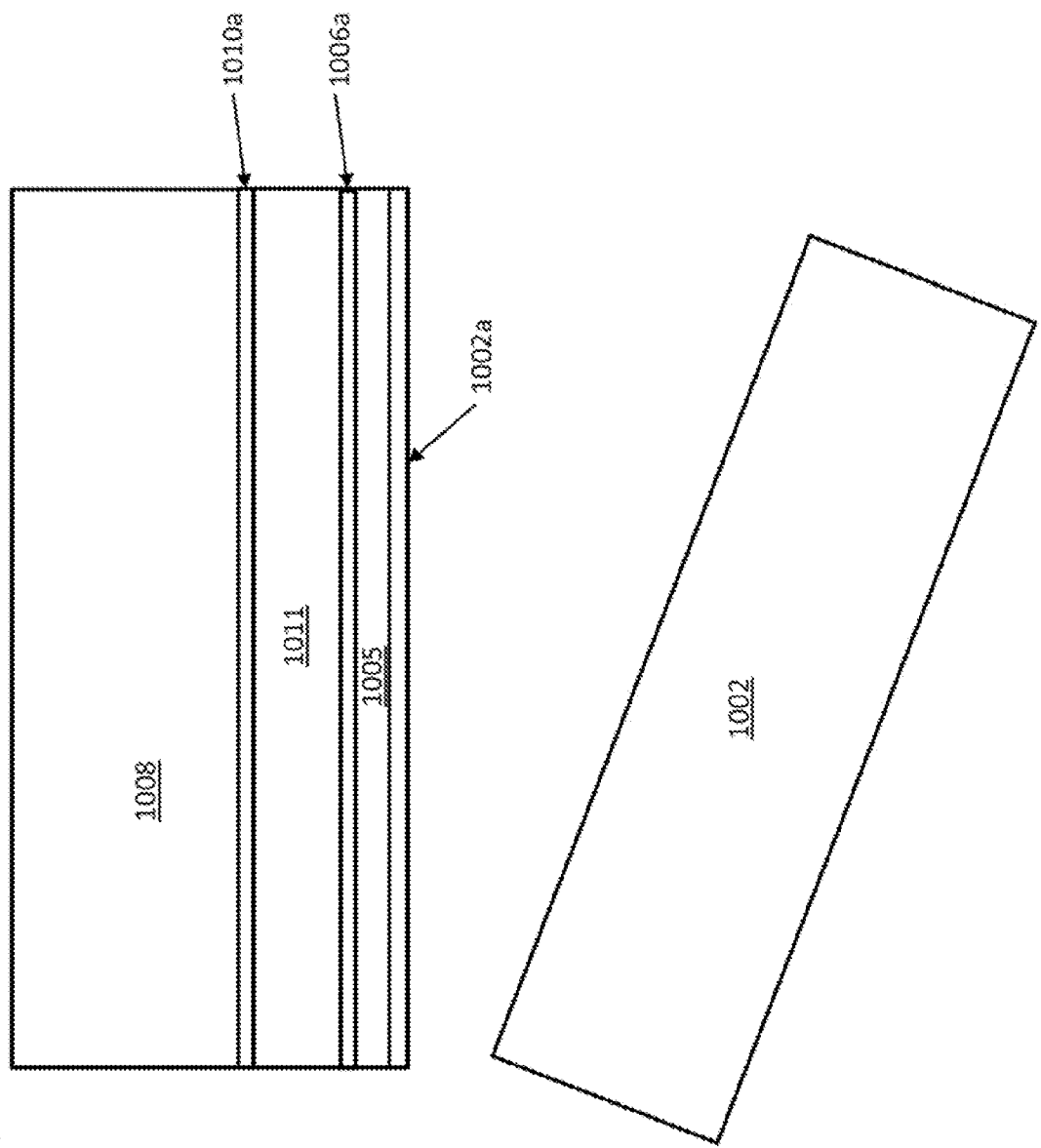
Figure 10:
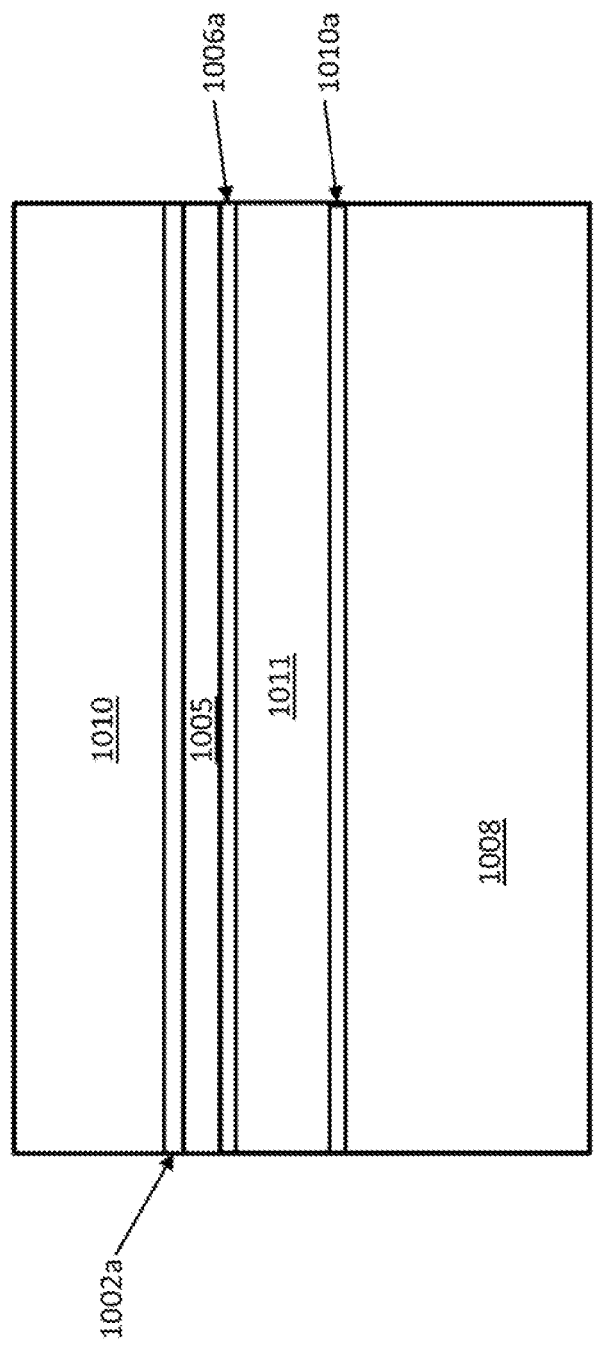

Referring to FIGS. 10(a-f), an exemplary solar cell device is constructed in accordance with an exemplary solder bond embodiment of the invention. It should be noted that although the various embodiments disclosed herein relate to a solar device, embodiments of the invention are not limited to solar devices and may be used in the construction of various microelectronic and optoelectronic devices. A monocrystalline donor substrate 1002 may be used to construct a semiconductor template layer (to subsequently serve as the template for epitaxial growth of a solar cell region) and a cleave plane used for separation prior to the epitaxial growth step. The donor substrate 1002 may be, for example, but not limited to, a (100) or (111) surface orientation. The donor substrate 1002 could be for example, but not limited to, germanium, GaAs or InP. The donor substrate 1002 may have a thickness of about 150-2000 microns, for example. The diameter of the donor substrate 1002 may be, but is not limited to, standard wafer sizes of about 50-200 mm. Alternately, a square or semi-square substrate may be used, of approximately 5" or 6" on a side, such as is commonly used in crystalline Si solar cells.

Cleave Plane Formation

Referring to FIG. 10a, according to the exemplary embodiment, the donor substrate 1002 may be implanted with a high dose of hydrogen (in the form of H or $H_2$) and/or helium atoms; e.g. $10^{16}$-$2\times10^{17}$ ions/cm$^2$ to define a cleave plane 1004, which defines semiconductor template layer 1002a. More specifically, the implant could be of $H_2$ with a implant dosage of about $3\times10^{16}$ to $5\times10^{16}$/cm$^2$. The implant energy defines the depth of the cleave plane 1004 and may be, e.g., 20-800 keV, to form a cleave plane at a depth of e.g. 10 to 5000 nm; more specifically the implant energy may be about 100-180 KeV. Other implant species such as boron, either singly or in combination with the above, may be useful as well.

Diffusion Barrier Deposition

Referring to FIG. 10b, a diffusion barrier 1005 is disposed on the surface of template layer 1002a. The diffusion barrier 1005 may be electrically conductive, and examples include silicon, titanium nitride, tantalum nitride, zirconium nitride, tungsten, and titanium-tungsten. It may be necessary to deposit a thin metal contact layer (not shown) on the surface of template layer 1002a prior to the deposition of diffusion barrier 1005, such as a Pd or Au or Ag layer, to enable a low-resistance electrical contact to semiconductor template layer 1002a. Such a layer, of thickness e.g. 10-50 nm, can be deposited by e.g. sputtering or evaporation, at a temperature below the temperature that will cause a split of the donor substrate at cleave plane 1004; for example, below about 250° C. Diffusion barrier 1005 may need to be sufficiently thick and dense to block diffusion of impurities during subsequent process steps from the bonding layers and carrier substrate into the subsequently transferred semiconductor template layer 1002a. Diffusion layer deposition temperature must be below the temperature that will cause a split of the donor substrate at cleave plane 1004; for example, below about 250° C. In another embodiment, diffusion barrier 1005 may be an insulating material such as a silicon oxide or silicon nitride, deposited by e.g. PECVD (again, below the temperature that will cause a split of the donor substrate at cleave plane 1004; for example, below about 250° C. In this case, it will be necessary to provide for electrical contact through the barrier layer; this may be achieved by patterning barrier layer 1005 (e.g. through photolithography, or by laser ablation as described in Jens Müller et al, Journal Of Applied Physics 108, 124513) prior to deposition of metal bonding layers 1006 as described below.

Bonding Layer Deposition on Donor

Referring to FIG. 10c, conductive metal bonding layers 1006 may be deposited on the surface of the diffusion barrier. In one embodiment, bonding layers 1006 may be comprised of a high melting point metal layer 1006a e.g. 0.5-5.0 microns thick, followed by a low-melting-point metal layer 1006b e.g. 0.5-5.0 microns thick. For example, the high melting point layer 1006a could be Ni or Ti, and the low melting point layer 1006b Sn. Alternately, the high melting point layer 1006a can be Cu, and the low melting point layer 1006b can be In. High melting point layer 1006a may be of thickness sufficient so that all of low melting point layer 1006b is consumed in the formation of intermetallic compound layer 1011 as described subsequently. For example, layer 1006a may be 50% thicker than layer 1006b. Additionally, deposition of high melting point layer 1006a may be preceded by deposition of a thin layer to promote adhesion such as Cr or Ti (e.g. 10-50 nm thick). All of these layers may be deposited by processes well known in the art such as, but not limited to, thermal evaporation, sputtering, electrodeposition, or screen printing. The deposition may be performed such that there is no exposure to an oxygen-containing ambient between the depositions of different metal layers, to prevent native oxide formation between the different metal layers.

Carrier Substrate Preparation

Referring to FIG. 10d, carrier substrate 1008 may be prepared for bonding to donor substrate 1002 including the template layer 1002a. The carrier substrate 1008 may be conductive, for example, a semiconductor such as metallurgical grade silicon; a metal such as steel or a low-CTE iron-nickel alloy such as Kovar™, Invar™, molybdenum, or tungsten; a conductive ceramic such as polycrystalline aluminum titanium nitride; or other suitable material. Alternately, the carrier substrate can be insulating, but may be coated with metal layers on some or all of its surfaces to allow it to function as a conductive back contact to the completed solar cell. For example, the carrier substrate 100 can be standard float glass or borosilicate glass coated (encapsulated) completely in a 1-10 micron thick metal layer, such as Ni or Al; such a coating may be applied by evaporation, sputtering, or electrodeposition, for example. The carrier substrate 1008 may be of the same or a similar size as the donor substrate 1002, or it may be larger such as to support multiple solar cells. The carrier substrate 1008 may be rigid with a thickness in the range of e.g. 100-500 microns. Alternatively, the carrier substrate 1008 may be flexible; for example, it may be a steel foil of thickness e.g. below 100 microns. The CTE of the carrier substrate may be approximately matched to that of semiconductor template layer 1002a, to allow for subsequent thermal processing steps necessary for subsequent formation of a solar cell, without giving rise to excessive stress in the transferred semiconductor layer or any semiconductor layers disposed due to a mismatch between the CTE of germanium (or other transferred semiconductor layer) and that of the carrier substrate. For example, the CTE of the carrier substrate may be less than about 5-10 ppm/° K. at room temperature, to provide an approximate match to a semiconductor template layer 1002a comprised of GaAs or Ge, which have a CTE in the range of 4-6 ppm/° K. at room temperature. The carrier substrate 1008 may have a peak-to-valley surface roughness of e.g. less than 2 microns, and a low local micro-roughness (preferably <1.0 micron root-mean-square roughness). Conductive metal bonding layers 1010 may be deposited on the surface of the carrier substrate 1008. In one embodiment, bonding layers 1010 may be comprised of a high melting point metal layer 1010a e.g. 0.5-5.0 microns thick, followed by a low-melting-point metal layer 1010b e.g. 0.5-5.0 microns thick. For example, the high melting point layer 1010a could be Ni or Ti, and the low melting point layer 1010b Sn. Alternately, the high melting point layer 1010a can be Cu, and the low melting point layer 1010b can be In. High melting point layer 1010a may be of thickness sufficient so that all of low melting point layer 1010b is consumed in the formation of intermetallic compound layer 1011 as described subsequently. For example, layer 1010a may be 50% thicker than layer 1010b. Additionally, deposition of high melting point layer 1010a may be preceded by deposition of a thin layer to promote adhesion such as Cr or Ti (e.g. 10-50 nm thick). All of these layers may be deposited by processes well known in the art such as, but not limited to, thermal evaporation, sputtering, electrodeposition, or screen printing. The deposition may be performed such that there is no exposure to an oxygen-containing ambient between the depositions of different metal layers, to prevent native oxide formation between the different metal layers. Note that the metal bonding layers 1010b and 1006b may be of the same material, for example both Sn; and the metal bonding layers 1010a and 1006a may be of the same material, for example both Ti or both Ni.

Bonding

The wafer bonding can be achieved in a tool such as an EVG (Electronic Visions Group) 510 bonder, or a SUSS SB6e bonder, or a heated mechanical press. In one embodiment, the donor wafer and carrier wafer are approximately the same size, and are brought substantially into alignment prior to contact, e.g. with not more than 1 mm lateral offset, within the bonding tool. Wafers may be brought into contact in a closed bonding chamber, in an ambient of e.g. nitrogen or air at a background pressure of e.g. 0.01-1 atm. After wafers are brought into contact a force of e.g. 0.1-1 MPa may be applied. While this force is maintained the contacted wafer pair may be brought to a peak temperature above the melting point of the low-melting-point metal. For example, this temperature may above 232° C. if the low-melting-point metal is Sn, or above 156° C. if the low-melting-point metal is In. However, the temperature may be below the temperature that will cause a split of the donor substrate at cleave plane 1004; for example, below about 250° C. This temperature may be maintained only briefly, e.g. 1-60 seconds. Alternately, the temperature may be maintained for e.g. 1-60 minutes. While the low-melting-point layers are in a liquid phase, they may conform to any non-planar topology at the bonded interface arising from (a) surface roughness of the donor or carrier wafer, (b) particles at the bonding interface, or (c) surface texturization, provided that such topology is thinner than the combined thickness of the low-melting-point metal layers on one or both of the donor and carrier wafer. Once the low melting point layers melt, diffusion between the low- and high-melting point metal layers will typically be enhanced. Referring to FIG. 4e, this may lead to the formation of an intermetallic layer 1011, comprised of the combined constituents the high- and low-melting point layers 1006a, 1006b, 1010a, and 1010b: e.g. $Ni_ySn_z$ (e.g. $Ni_3Sn_4$) or $Ti_wSn_x$ (e.g. $Ti_6Sn_5$) or $Cu_uIn_v$ (e.g. $Cu_2In$). The intermetallic compound layer may have a melting point substantially higher than the melting point of the low-melting-point metal layers, and so the intermetallic compound layer may solidify isothermally even while the metal layer stack is still exposed to the bonding temperature. This approach to metallic bonding, where a resulting intermetallic metal bonding layer has a melting point higher than some of the constituent layers, has been referred to as transient liquid phase bonding, as described in "Transient Liquid Phase Bonding" by W. D. MacDonald and T. W. Eagar, Anna. Rev. Maier. Sci. 1992.22:23-46. This process may consume substantially all of the low melting point layers 1006b and 1010b, so the bonded metal joint will remain solid for temperatures well above the melting point of the low melting point metal. The process may leave some of high melting point layers 1010a and/or 1006a unconsumed in the formation of intermetallic compound layer 1011.

In one exemplary embodiment, 1 µm of Si donor substrate 1002 is bonded to a carrier substrate 1008 of Kover using a 2 µm intermetallic compound layer with a high melting point layer 1010*a* of Ti, and the low melting point layer 1010*b* of Sn. The bonding process may be designed to use a minimum temperature to allow complete or substantial mixing of the low melting point layer 1010*b* into the high melting point layer 1010*a*. The process can therefore use all of the lower melting point layer 1010*b* and prevents a weaker, lower melting point residual layer after formation of the intermetallic compound layer. In the example, a 500N initial pressure is ramped up to 9000N at a rate of 1500N/min and held for 1 minute. A bonding temperature of 450 degrees Celsius may be obtained at a rate of 30 C/min and maintained for a duration of 10 seconds and then allowed to cool to a temperature of 100 degrees Celsius. The process can provide for the complete reaction of the Sn layer into the formation of the $Ti_6Sn_5$ layer. Other temperatures and duration may be optimized for other combinations of materials to allow complete utilization of the lower melting point layer 1010*b*.

Cleaving

Referring to FIG. 10*e*, the donor substrate 1002 may be removed from the semiconductor template layer 1002*a* bonded to the carrier substrate 1008, by exposing the donor substrate 1002 to a sufficiently high temperature to induce exfoliation at the cleave plane. For example, this temperature may be above 250° C. More specifically, it may be in the range of 300° C.-400° C.

Solar Cell Formation

Referring to FIG. 10*f*, once the carrier substrate 1008 and semiconductor template layer 1002*a* have been removed from be donor substrate 1002, various processing steps may be performed to form a solar cell over carrier substrate 1008. The subsequent diagrams are also flipped vertically from previous diagrams with the bonding interface no longer illustrated. Optionally, the surface of template layer 1002*a*, which may be rough and damaged due to the ion implant and separation process, may be removed with wet acid etch or polishing; the amount of removal may be up to about e.g. 300 nm. Next, compound semiconductor layers 1010 may be grown by e.g. MOCVD or MBE, as well known in the art, to form a single junction solar cell, for example a GaAs solar cell. Alternately, a multijunction solar cell can be grown, connected by tunnel junctions as described in, for example, R. R. King, D. C. Law, K. M. Edmondson, C. M. Fetzer, G. S. Kinsey, H. Yoon, R. A. Sherif, and N. H. Karam, "40% Efficient Metamorphic GaInP/GaInAs/Ge Multijunction Solar Cells," Applied Physics Letters 90 (2007) 183516. Finally, top surface solar cell processing may include deposition of anti-reflection coatings (not shown) and formation of metal contact lines, all well-known in the art of solar cell manufacturing. Also after splitting, the donor substrates 1002 may be processed for reuse in the next wafer production cycle. This processing may include polishing, wet etching, or otherwise cleaning of the cleaved surface for subsequent formation of cleave planes in future wafer production cycles.

Completed Solar Cell

Referring to FIG. 10*f*, the cell on the carrier substrate 1008 may have the exemplary basic cell structure. P-type semiconductor template layer 1002*a*, for example of GaAs, is bonded to carrier substrate 1008 via solder bonding. III-V epitaxial layers 1010 comprising one or more solar cell junctions are disposed over semiconductor template layer 1002*a*. The III-V epitaxial layers may include alloys of Al, In, Ga, As, P, and N.

It should be noted that the solar cell structure is for illustrative purposes and the invention is not limited to the disclosed structure. Various devices may be constructed and materials can be deposited by a variety of techniques, including thermal or e-beam evaporation, DC or RF sputtering, electroplating, molecular beam epitaxy (MBE), atomic layer deposition (ALD), pulsed-laser deposition (PLD), spin coating, MOCVD, HVPE, liquid phase epitaxy (LPE), screen printing, or any other suitable technique. Materials can be annealed or undergo chemical reactions following deposition, or after additional materials or reactants are deposited or placed in proximity.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of this invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications. These procedures will enable others, skilled in the art, to best utilize the invention and various embodiments with various modifications. It is intended that the scope of the invention be defined by the following claims and their equivalents. Modifications and substitutions by one of ordinary skill in the art are considered to be within the scope of the present invention, which is not to be limited except by the following claims.

The invention claimed is:

1. A monocrystalline solar cell device, comprising:
  a monocrystalline donor substrate having a monocrystalline donor layer and a porous layer in between the monocrystalline donor layer and a remainder of the monocrystalline donor substrate wherein the monocrystalline donor layer has a thickness below 100 microns prior to the porous layer and
  a steel alloy carrier substrate wherein an intermetallic alloy solder directly bonding layer bonds the donor layer to the steel alloy carrier substrate.

2. The monocrystalline solar cell device of claim 1, wherein the solder bonding layer comprises a layer of one of tin and indium sandwiched between layers of one of nickel and titanium.

3. The monocrystalline solar cell device of claim 1, wherein the solder bonding layer comprises a low-melting-point metal layer sandwiched between layers of one of nickel and titanium.

4. The monocrystalline solar cell device of claim 1, wherein the solder bonding layer comprises a low-melting-point metal layer with a thickness of about 0.5-5 microns sandwiched between adhesion layers with a thickness of about 10-50 nanometers.

5. The monocrystalline solar cell device of claim 1, wherein the monocrystalline donor layer further comprises:
  a solar cell base contact region of N+ epitaxially grown and transferred silicon,
  a solar cell base region of N-type epitaxially grown and transferred silicon, and
  a solar cell emitter region of P+ epitaxially grown and transferred silicon.

6. The monocrystalline solar cell device of claim 1, wherein the monocrystalline donor layer further comprises a solar cell base contact region and the solder bonding layer provides a buried conductive layer providing a bottom electrical contact.

7. The monocrystalline solar cell device of claim 1, wherein the monocrystalline donor layer further comprises a base solar cell region and the solder bonding layer provides light reflection for light absorption in the base solar cell region.

8. The monocrystalline solar cell device of claim 1, wherein the intermetallic layer comprises a compound including Ni and Sn.

9. The monocrystalline solar cell device of claim 1, wherein the intermetallic layer comprises a compound including Ti and Sn.

10. The monocrystalline solar cell device of claim 1, wherein the intermetallic layer comprises a compound including Cu and In.

11. The monocrystalline solar cell device of claim 1, wherein the intermetallic alloy solder bonding layer has a remelting point higher than that of a component metal of the intermetallic alloy in pure form.

12. A monocrystalline solar cell device, comprising:
   a monocrystalline donor layer with a thickness below 100 microns and a carrier substrate wherein an intermetallic layer bonds the donor layer to the carrier substrate and wherein the intermetallic layer comprises a compound including Ti and Sn, the monocrystalline donor layer is silicon, and the carrier substrate is a steel alloy.

13. The monocrystalline solar cell device of claim 12, wherein the monocrystalline donor layer further comprises:
   a solar cell base contact region of N+ silicon epitaxially grown,
   a solar cell base region of N-type silicon epitaxially grown, and
   a solar cell emitter region of P+ epitaxially grown.

14. The monocrystalline solar cell device of claim 12, wherein the monocrystalline donor layer further comprises a solar cell emitter, and where the intermetallic layer provides a buried electrical pathway to the solar cell emitter.

15. The monocrystalline solar cell device of claim 12, wherein the monocrystalline donor layer is germanium or gallium arsenide.

16. The monocrystalline solar cell device of claim 12, wherein the monocrystalline donor layer is a compound semiconductor.

* * * * *